United States Patent
Mikawa et al.

(10) Patent No.: US 7,180,122 B2
(45) Date of Patent: Feb. 20, 2007

(54) SEMICONDUCTOR DEVICE AND METHOD FOR FABRICATING THE SAME

(75) Inventors: Takumi Mikawa, Otsu (JP); Yuji Judai, Uji (JP); Toshie Kutsunai, Kusatsu (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 81 days.

(21) Appl. No.: 10/823,797

(22) Filed: Apr. 14, 2004

(65) Prior Publication Data

US 2005/0012133 A1  Jan. 20, 2005

Related U.S. Application Data

(63) Continuation of application No. PCT/JP04/03450, filed on Mar. 12, 2004, now abandoned.

(30) Foreign Application Priority Data

May 27, 2003  (JP) ............................. 2003-149444

(51) Int. Cl.
*H01L 27/108* (2006.01)
*H01L 29/76* (2006.01)
*H01L 29/94* (2006.01)
*H01L 31/062* (2006.01)
*H01L 31/119* (2006.01)

(52) U.S. Cl. ...................... 257/310; 257/295; 257/296; 257/294; 257/298; 257/299; 257/300; 257/301; 257/302; 257/303; 257/304; 257/305; 257/306; 257/307; 257/308; 257/309; 257/311; 257/312; 257/313

(58) Field of Classification Search .......... 257/295, 257/296–313

See application file for complete search history.

(56) References Cited

U.S. PATENT DOCUMENTS

| | | | | |
|---|---|---|---|---|
| 6,211,035 B1* | 4/2001 | Moise et al. | ............... | 438/396 |
| 6,316,275 B2* | 11/2001 | Hopfner | ................ | 438/3 |
| 6,395,612 B1* | 5/2002 | Amanuma | .................. | 438/393 |
| 6,509,601 B1* | 1/2003 | Lee et al. | .................. | 257/310 |
| 6,611,014 B1* | 8/2003 | Kanaya et al. | ............... | 257/295 |
| 6,611,449 B1* | 8/2003 | Hilliger | .................... | 365/145 |
| 6,664,578 B2* | 12/2003 | Lee et al. | .................. | 257/295 |
| 6,730,951 B2* | 5/2004 | Nagano et al. | ............ | 257/296 |
| 6,781,184 B2* | 8/2004 | Solayappan et al. | ........ | 257/310 |
| 6,900,095 B2* | 5/2005 | Yoon | .......................... | 438/241 |
| 6,958,508 B2* | 10/2005 | Mikawa | ..................... | 257/306 |
| 6,982,444 B2* | 1/2006 | Kanaya et al. | ............ | 257/295 |
| 2003/0006439 A1* | 1/2003 | Bailey | ........................ | 257/295 |
| 2004/0101977 A1* | 5/2004 | Celinska et al. | ............. | 438/3 |

FOREIGN PATENT DOCUMENTS

EP  1 298 730 A2  4/2003

(Continued)

*Primary Examiner*—Ida M. Soward
(74) *Attorney, Agent, or Firm*—McDermott Will & Emery LLP

(57) ABSTRACT

A semiconductor device includes a first hydrogen barrier film, a capacitor device formed on the first hydrogen barrier film, and a second hydrogen barrier film formed to cover the capacitor device. The first and second hydrogen barrier films each contain at least one common type of atoms for allowing the first and second hydrogen barrier films to adhere to each other.

6 Claims, 12 Drawing Sheets

FOREIGN PATENT DOCUMENTS

| | | |
|---|---|---|
| EP | 1298730 A2 | 4/2003 |
| JP | 11-8355 | 1/1999 |
| JP | 11-126881 A | 5/1999 |
| JP | 11-135736 | 5/1999 |
| JP | P3098474 | 8/2000 |
| JP | 2001-7303 A | 1/2001 |
| JP | 2001-237393 A | 8/2001 |
| JP | 2002-110931 A | 4/2002 |
| JP | 2003-68987 A | 3/2003 |
| JP | 2003-086771 A | 3/2003 |
| JP | 2003-224209 A | 8/2003 |

* cited by examiner

SEMICONDUCTOR DEVICE AND METHOD FOR FABRICATING THE SAME

The present invention is a continuation of International PCT Application No. PCT/JP2004/003450 filed on Mar. 12, 2004, now abandoned.

BACKGROUND OF THE INVENTION

The present invention relates to semiconductor devices in which hydrogen is prevented from diffusing into a capacitor insulating film of a ferroelectric film or a high dielectric film forming a capacitor device, and to methods for fabricating such a semiconductor device.

The trend in ferroelectric memory devices is that those of planar structures having a small capacity of 1 to 64 kbit start being produced in volume. Recently, the center of development of the ferroelectric memory devices has been shifting to those of stack structures having a large capacity of 256 kbit to 4 Mbit. To realize the stacked ferroelectric memory device, a significant improvement of the packing density thereof, and by extension microfabrication thereof are indispensable. To attain this, it becomes important to harmonize formation steps of a ferroelectric capacitor, a transistor, and an interconnect.

This harmonization causes a problem in a semiconductor device fabrication process many steps of which are performed in a hydrogen atmosphere as represented by a contact filling technique using W-CVD or heat treatment in the hydrogen atmosphere performed for restoring transistor characteristics. The problem is to retain the polarization properties of a ferroelectric film of a ferroelectric capacitor while no ferroelectric capacitor is reduced.

One of conventionally common techniques is coating of the ferroelectric capacitor with a hydrogen barrier film. In this technique, the hydrogen barrier film represented by an aluminum oxide film or a silicon nitride film shields the capacitor from hydrogen diffusion occurring during the ferroelectric capacitor formation step and later steps in a semiconductor device fabrication process, thereby preventing a decrease in the amount of polarization of the ferroelectric film. The structure in which the hydrogen barrier film covers the entire surrounding of the ferroelectric capacitor is employed as a covering structure of the capacitor, and most effectively prevents degradation of the polarization properties of the ferroelectric film (see, for example, Japanese Patent No. 3098474). Thus, degradation of the polarization properties of the ferroelectric capacitor which is caused by hydrogen is prevented to realize a highly integrated ferroelectric memory device or high dielectric memory device.

Hereinafter, a conventional semiconductor device having a ferroelectric capacitor with the entire surrounding thereof covered will be described with reference to FIG. 11. FIG. 11 is a sectional view of the conventional semiconductor device.

Referring to FIG. 11, in a surface portion of a semiconductor substrate 10, doped layers 11 are formed apart from each other. A gate oxide film 12 and a gate electrode 13 are formed above the semiconductor substrate 10, and sidewalls 14 are formed on side surfaces of the gate oxide film 12 and the gate electrode 13. An isolation oxide film 15 is formed on the semiconductor substrate 10. Above the semiconductor substrate 10, a first interlayer insulating film 16 is formed to cover the gate oxide film 12, the gate electrode 13, the sidewalls 14, and the isolation film 15. A first hydrogen barrier film 17 is formed on the first interlayer insulating film 16.

On the first hydrogen barrier film 17, a ferroelectric capacitor is formed which is composed of a lower electrode 18, a capacitor insulating film 19 made of a ferroelectric film, and an upper electrode 20. A second hydrogen barrier film 21 is formed on the upper electrode 20. On the first hydrogen barrier film 17, a third hydrogen barrier film 22 is formed to cover side surfaces of the ferroelectric capacitor and the second hydrogen barrier film 21. On the first interlayer insulating film 16, a second interlayer insulating film 23 is formed to cover the first hydrogen barrier film 17 and the third hydrogen barrier film 22. Interconnects 24a and 24b are formed on the second interlayer insulating film 23. The interconnect 24a passes through the second interlayer insulating film 23 and the third hydrogen barrier film 22 and is connected to the upper surface of the second hydrogen barrier film 22. The interconnects 24a and 24b pass through the first interlayer insulating film 16 and the second interlayer insulating film 23 and is connected to the upper surface of the doped layer 11.

As shown above, the entire surrounding of the ferroelectric capacitor in FIG. 11 is covered with the first, second and third hydrogen barrier films 17, 21 and 22. Therefore, even though the ferroelectric capacitor is subjected to heat treatment in a reducing atmosphere in the ferroelectric capacitor formation step and later process steps, hydrogen diffusion into the capacitor insulating film 19 can be suppressed. This decreases degradation of the polarization properties of the ferroelectric film forming the capacitor insulating film 19.

When the inventors performed heat treatment in a reducing atmosphere on a ferroelectric capacitor, as mentioned above, with the hydrogen barrier films covering the surrounding thereof, however, it turned out that degradation of the polarization properties of the ferroelectric film forming the capacitor insulating film cannot be prevented completely. In particular, when hydrogen annealing was performed at high concentration, such an incomplete prevention became outstanding.

Hereinafter, this disadvantage will be described concretely with reference to FIGS. 12, 13, 14, 15(a) and 15(b).

The inventors performed heat treatment in a reducing atmosphere on a ferroelectric capacitor, as shown in FIG. 12, with the hydrogen barrier films covering the surrounding thereof.

As shown in FIG. 12, a first interlayer insulating film 31 is formed on a semiconductor substrate 30 in which a memory cell transistor (its illustration is omitted) is formed. A first hydrogen barrier film 32 made of a silicon nitride film is formed on the first interlayer insulating film 31. A second hydrogen barrier film 33 with electrical conductivity is formed on the first hydrogen barrier film 32. On the second hydrogen barrier film 33, a ferroelectric capacitor is formed which is composed of a lower electrode 34 with the surface layer made of a platinum film, a capacitor insulating film 35 made of, for example, an SBT (SrTaBiO) film as a ferroelectric film, and an upper electrode 36 made of a platinum film.

On the first hydrogen barrier film 32, a second interlayer insulating film 37 for smoothing irregularities on the surface of the ferroelectric capacitor is formed to cover side surfaces of the second hydrogen barrier film 33 and the ferroelectric capacitor. On the first interlayer insulating film 31, a third hydrogen barrier film 38 made of a titanium aluminum oxide film is formed to cover side surfaces of the first hydrogen barrier film 32 and the second interlayer insulating film 37.

A contact plug 39 is formed to pass through the first hydrogen barrier film 32 and the first interlayer insulating film 31. The contact plug 39 connects the semiconductor substrate 30 to the lower electrode 34 of the ferroelectric capacitor via the second hydrogen barrier film 33.

As shown above, the ferroelectric capacitor in FIG. 12 has the structure in which the entire surrounding thereof is covered with the first, second and third hydrogen barrier films 32, 33 and 38. Therefore, even though the ferroelectric capacitor is subjected to heat treatment in a reducing atmosphere in the ferroelectric capacitor formation step and later process steps, hydrogen diffusion into the capacitor insulating film 35 is suppressed. This prevents degradation of the polarization properties of the ferroelectric film forming the capacitor insulating film 35.

FIG. 13 shows the polarization properties of the capacitor insulating films 35 made of a ferroelectric film when the ferroelectric capacitors shown in FIG. 12 were subjected to heat treatment at 400° C. for ten minutes in atmospheres containing 4% hydrogen and 100% hydrogen, respectively. As is apparent from FIG. 13, in the cases where the ferroelectric capacitors were subjected to heat treatment in the atmospheres containing 4% hydrogen and 100% hydrogen, respectively, the amounts of polarization of the capacitor insulating films 35 formed of a ferroelectric film were decreased. In particular, when the capacitor was subjected to heat treatment in a highly reducing atmosphere as shown in the case of heat treatment in the atmosphere containing 100% hydrogen, it turned out that the extent to which the polarization properties of the ferroelectric film are degraded is large.

FIG. 14 is a TEM cross-sectional view of the contact portion between the first hydrogen barrier film 32 and the second hydrogen barrier film 38 after the heat treatment at 400° C. for ten minutes in the atmosphere containing 100% hydrogen shown in FIG. 13. As is apparent from FIG. 14, the occurrence of a gap was observed in a contact portion 12A between the first hydrogen barrier film 32 made of a silicon nitride film and the third hydrogen barrier film 38 made of a titanium aluminum oxide film.

From the foregoing, the inventors found that degradation of polarization properties of the ferroelectric film results from hydrogen diffusion through the interface at which the hydrogen barrier films come into contact with each other. That is to say, the inventors found that since the extent to which the polarization properties of the ferroelectric film are degraded greatly depends upon the adhesion between the hydrogen barrier films, selection of materials used for the hydrogen barrier films or the state of the contact surface between the hydrogen barrier films coming into contact with each other is of extreme importance.

To carry out a detailed analysis of the state of contact in the above-mentioned contact portion 12A between the first hydrogen barrier film 32 and the third hydrogen barrier film 38, the inventors conducted exemplary experiments using the structure as shown in FIG. 15(a) in which the hydrogen barrier films were in simulated contact with each other.

The structure shown in FIG. 15(a) was formed by sequentially growing above a semiconductor substrate (not shown), a silicon nitride film (a first hydrogen barrier film) and a titanium aluminum oxide film (a second hydrogen barrier film) from bottom to top. The inventors observed the cross section of this structure with a TEM.

From this observation, as shown in FIG. 15(a), the existence of an altered layer with a thickness of about 3.0 nm was recognized in the contact portion (the interface) between the silicon nitride (SiN) film and the titanium aluminum oxide (TiAlO) film.

Furthermore, using EELS (Electron Energy Loss Spectroscopy), the inventors analyzed the altered layer formed at the interface between the silicon nitride film and the titanium aluminum oxide film and the silicon nitride film shown in FIG. 15(a). Then, as shown in FIG. 15(b), a Si—O peak was detected from the result of the analysis of the altered layer. Note that FIG. 15(b) is a TEM cross-sectional view for illustrating the EELS analysis result obtained by the experimental sample of the contact portion between the first and second hydrogen barrier films, and a graph illustrating the relation between the loss energy (eV) and the intensity of the experimental sample.

On the basis of this experimental result, the inventors determined that the altered layer formed at the interface between the silicon nitride film and the titanium aluminum oxide film was a silicon oxide film. This determination results from the assumption that silicon (Si) in the silicon nitride film and oxygen (O) in the titanium aluminum oxide come into contact with each other and they are then subjected to heat treatment in a later process step (e.g., heat treatment for crystallizing a capacitor insulating film), thereby producing stable Si—O bonds.

According to the experimental result described above, it can be considered that even the contact portion between the actual hydrogen barrier films composed of a silicon nitride film and a titanium aluminum oxide film, respectively, is formed with Si—O bonds to create a silicon oxide film.

A silicon oxide film does not have barrier properties of preventing hydrogen entry from the outside. Thus, the contact portion between the silicon nitride film and the titanium aluminum oxide film, which is formed with the silicon oxide film, is sensitive to hydrogen, so that this portion serves to transmit hydrogen from the outside.

Unlike the structure in FIG. 15(a), the contact portion 12A shown in FIG. 14 actually extends in the vertical direction. Therefore, the state of contact between the hydrogen barrier films is poorer than that of the simulatively formed experimental sample. Furthermore, considering that a film stress is easily concentrated on the contact portion 12A, it is expected that Si—O bonds are created in parts of the contact portion 12A. In other words, it is expected that the contact portion. 12A is in a condition where silicon oxide films composed of Si—O bonds and gaps are mixed therein.

Hence, in the contact portion 12A, both the region formed with Si—O bonds and the region formed with the gap do not have the hydrogen barrier properties at all. This means that, as shown in FIG. 14, the contact portion 12A serves as a hydrogen diffusion path. Conversely, in the combination of one hydrogen barrier film and the other hydrogen barrier film coming into contact with each other, detection of Si—O bonds in the contact portion between the hydrogen barrier films suggests a high possibility of creating a hydrogen diffusion path.

In the case of the above-mentioned conventional semiconductor device shown in FIG. 11, the first hydrogen barrier film 17 is made of a silicon nitride film with a thickness of 10 to 200 nm which is formed by a low pressure CVD method or a spattering method. The second hydrogen barrier film 21 is made of a titanium nitride film with a thickness of 50 nm which is formed by a spattering method. The third hydrogen barrier film 22 is made of a stacked film formed by sequentially stacking a silicon oxide film and a silicon nitride film from bottom to top, or a film containing oxygen and nitrogen such as a silicon oxynitride film.

Since the stacked film inherently has poor hydrogen barrier properties, it is conceivable that if the stacked film of a silicon oxide film and a silicon nitride film is used as the third hydrogen barrier film 22, however, the polarization properties of the ferroelectric film of the conventional semiconductor device shown in FIG. 11 are degraded to a large extent. Moreover, in the case of the conventional semiconductor device shown in FIG. 11, the structure in which the first, second, and third hydrogen barrier films 17, 21, and 22 cover the entire ferroelectric capacitor is employed for the purpose of reducing degradation of the polarization properties of the ferroelectric film. However, no disclosure is made of which materials are selected for the hydrogen barrier films or how surface treatment is performed on the hydrogen barrier films by noting that the point of view of improving the adhesion between the hydrogen barrier films in contact with each other at the contact portion. Even a discussion from such a viewpoint has not been conducted yet.

DISCLOSURE OF INVENTION

In view of the foregoing, an object of the present invention is to decrease, when a ferroelectric capacitor is subjected to heat treatment in a reducing atmosphere, degradation of the polarization properties of a capacitor insulating film by improving the adhesion between hydrogen barrier films in contact with each other at the contact portion.

To accomplish the above object, a first semiconductor device of the present invention is characterized by comprising: a first hydrogen barrier film; a capacitor device formed on the first hydrogen barrier film; and a second hydrogen barrier film formed to cover the capacitor device. This device is further characterized in that the first and second hydrogen barrier films each contain at least one common type of atoms for allowing the first and second hydrogen barrier films to adhere to each other.

In the first semiconductor device, the first and second hydrogen barrier films each contain atoms of the same type for promoting adhesion to each other. This improves the adhesion between the first and second hydrogen barrier films, which suppresses hydrogen diffusion into a capacitor insulating film of the capacitor device through the interface at which the first and second hydrogen barrier films come into contact with each other. This enables a decrease in degradation of the polarization properties of the capacitor insulating film made of a ferroelectric film or a high dielectric film.

Preferably, in the first semiconductor device, around the perimeter of the capacitor device, the first and second hydrogen barrier films adhere to each other by chemical bonding of the atoms of the common type.

With this structure, the first and second hydrogen barrier films are not merely in physical contact with but in chemical connection with each other by the chemical bonding of the atoms of the same type. This improves the adhesion between the first and second hydrogen barrier films.

Preferably, in the first semiconductor device, the atoms are nitrogen atoms or oxygen atoms.

This structure can form the first and second hydrogen barrier films by a relatively easy process and improve the adhesion between the first and second hydrogen barrier films.

Also, to accomplish the foregoing object, a second semiconductor device of the present invention is characterized by comprising: a first hydrogen barrier film; a capacitor device formed on the first hydrogen barrier film; and a second hydrogen barrier film formed to cover the capacitor device. This device is further characterized in that the first and second hydrogen barrier films each contain metal atoms for allowing the first and second hydrogen barrier films to adhere to each other by mutual diffusion action of the metal atoms therebetween, and around the perimeter of the capacitor device, the first and second hydrogen barrier films adhere to each other by the mutual diffusion action of the metal atoms therebetween.

In the second semiconductor device, the first and second hydrogen barrier films each contain metal atoms for promoting adhesion to each other. Since metal atoms have high diffusion coefficients, they can improve the adhesion between the first and second hydrogen barrier films. In other words, the first and second hydrogen barrier films adhere to each other by the mutual diffusion action of the metal atoms therebetween. This suppresses hydrogen diffusion into the capacitor insulating film through the interface at which the first and second hydrogen barrier films come into contact with each other. As a result, degradation of the polarization properties of the capacitor insulating film made of a ferroelectric film or a high dielectric film can further be decreased.

Preferably, in the second semiconductor device, the metal atoms are Ti or Ta.

In this structure, Ti or Ta has a high diffusion coefficient and thus serves well to improve the adhesion between the first and second hydrogen barrier films. Therefore, degradation of the polarization properties of the capacitor insulating film made of a ferroelectric film or a high dielectric film can be significantly decreased.

Also, to accomplish the foregoing object, a third semiconductor device of the present invention is characterized by comprising: a first hydrogen barrier film; a capacitor device formed on the first hydrogen barrier film; and a second hydrogen barrier film formed to cover the capacitor device. This device is further characterized in that around the perimeter of the capacitor device, the first and second hydrogen barrier films are connected to each other with an adhesion layer interposed therebetween.

In the third semiconductor device, the adhesion layer is interposed between the first and second hydrogen barrier films to improve the adhesion between the first and second hydrogen barrier films. This decreases degradation of the polarization properties of the capacitor insulating film made of a ferroelectric film or a high dielectric film while the selection range of materials used for the first and second hydrogen barrier films is not limited at all.

Preferably, in the third semiconductor device, the adhesion layer occludes hydrogen.

With this structure, minute quantities of hydrogen diffused in the adhesion layer can be captured, so that hydrogen which would otherwise diffuse into the capacitor insulating film can be suppressed effectively. This further reduces degradation of the polarization properties of the capacitor insulating film made of a ferroelectric film or a high dielectric film.

Preferably, in the third semiconductor device, the adhesion layer contains transition metal.

With this structure, hydrogen diffusion can be prevented by utilizing the metal capable of occuluding hydrogen. Moreover, this structure can further promote the effect of allowing the first and second hydrogen barrier films to adhere to each other.

Preferably, in the third semiconductor device, the adhesion layer contains Ti or Ta.

Since Ti and Ta have high diffusion coefficients, this structure can further promote the effect of allowing the first and second hydrogen barrier films to adhere to each other.

Also, to accomplish the foregoing object, a fourth semiconductor device of the present invention is characterized by comprising: a first hydrogen barrier film having an oxidized region in a surface thereof; a capacitor device formed on the first hydrogen barrier film; and a second hydrogen barrier film which contains oxygen and which is formed to cover the capacitor device. This device is further characterized in that the first and second hydrogen barrier films adhere to each other by oxygen bonding while the oxidized region located around the perimeter of the capacitor device is interposed therebetween.

In the fourth semiconductor device, oxygen bonds are formed between oxygen atoms contained in the oxidized region of the first hydrogen barrier film and oxygen atoms contained in the second hydrogen barrier film. Thus, the first and second hydrogen barrier films are not merely in physical contact with but in chemically bonded adhesion to each other. In other words, the first and second hydrogen barrier films adhere to each other by utilizing oxygen atoms as bridges. This suppresses hydrogen diffusion into the capacitor insulating film through the interface at which the first and second hydrogen barrier films come into contact with each other, which further decreases degradation of the polarization properties of the capacitor insulating film made of a ferroelectric film or a high dielectric film.

Also, to accomplish the foregoing object, a fifth semiconductor device of the present invention is characterized by comprising: a first hydrogen barrier film having a nitrided region in a surface thereof; a capacitor device formed above the first hydrogen barrier film; and a second hydrogen barrier film which contains nitrogen and which is formed to cover the capacitor device. This device is further characterized in that the first and second hydrogen barrier films adhere to each other by nitrogen bonding while the nitrided region located around the perimeter of the capacitor device is interposed therebetween.

In the fifth semiconductor device, nitrogen bonds are formed between nitrogen atoms contained in the nitrided region of the first hydrogen barrier film and nitrogen atoms contained in the second hydrogen barrier film. Thus, the first and second hydrogen barrier films are not merely in physical contact with but in chemically bonded adhesion to each other. In other words, the first and second hydrogen barrier films adhere to each other by utilizing nitrogen atoms as bridges. This suppresses hydrogen diffusion into the capacitor insulating film through the interface at which the first and second hydrogen barrier films come into contact with each other, which further decreases degradation of the polarization properties of the capacitor insulating film made of a ferroelectric film or a high dielectric film.

Preferably, in the first to fourth semiconductor devices, the first and second hydrogen barrier films adhere to each other so that no silicon oxide film is interposed between the first and second hydrogen barrier films.

With this structure, no silicon oxide film is interposed which serves as a path for hydrogen diffusion into the capacitor insulating film. This further decreases degradation of the polarization properties of the capacitor insulating film made of a ferroelectric film or a high dielectric film.

Preferably, in the first to fourth semiconductor devices, the first and second hydrogen barrier films are films made of the same material.

This structure improves the adhesion between the first and second hydrogen barrier films and eliminates influences of thermal expansion, thermal contraction, or stress variation caused by heat treatment in a later process step. Therefore, the contact portion between the first and second hydrogen barrier films is thermally stabilized to further decrease degradation of the polarization properties of the capacitor insulating film made of a ferroelectric film or a high dielectric film.

Preferably, in the first to fourth semiconductor devices, the capacitor device comprises a lower electrode formed above the first hydrogen barrier film, a capacitor insulating film formed on the lower electrode, and an upper electrode formed oh the capacitor insulating film, and the capacitor insulating film is made of a ferroelectric film or a high dielectric film.

Preferably, in the first to fourth semiconductor devices, the capacitor insulating film is made of $SrBi_2(Ta_xNb_{1-x})_2O_9$, $Pb(Zr_xTi_{1-x})O_3$, $(Ba_xSr_{1-x})TiO_3$, $(Bi_xLa_{1-x})_4Ti_3O_{12}$ (where x satisfies $0 \leq x \leq 1$ in the above chemical formulas), or $Ta_2O_5$.

Also, to accomplish the foregoing object, a first method for fabricating a semiconductor device of the present invention is characterized by comprising the steps of: forming a first hydrogen barrier film; forming a capacitor device on the first hydrogen barrier film; and forming a second hydrogen barrier film so that the second hydrogen barrier film covers the capacitor device and comes into contact with the first hydrogen barrier film around the perimeter of the capacitor device. This method is further characterized in that the first and second hydrogen barrier films each contain at least one common type of atoms for allowing the first and second hydrogen barrier films to adhere to each other, and the first and second hydrogen barrier films adhere to each other by chemical bonding of the atoms of the common type.

In the first formation method of a semiconductor device, the first and second hydrogen barrier films each contain atoms of the common type for promoting adhesion to each other. This improves the adhesion between the first and second hydrogen barrier films. In other words, the first and second hydrogen barrier films are not merely in physical contact with but in chemical connection to each other by the chemical bonding of the atoms of the same type. This improves the adhesion between the first and second hydrogen barrier films, which suppresses hydrogen diffusion into a capacitor insulating film of the capacitor device through the interface at which the first and second hydrogen barrier films come into contact with each other. This enables a decrease in degradation of the polarization properties of the capacitor insulating film made of a ferroelectric film or a high dielectric film.

Preferably, in the first formation method of a semiconductor device, the step of etching an exposed portion of the surface of the first hydrogen barrier film is provided between the capacitor device formation step and the second hydrogen barrier film formation step, the exposed portion being located around the perimeter of the capacitor device, and the etching dissociates bonds of combining atoms of the type commonly contained in the first and second hydrogen barrier films to produce dangling bonds.

With this method, the atoms of the common type contained in both the first and second hydrogen barrier films dissociates their bonds in combination with other atoms in the first hydrogen barrier film and then produces dangling bonds. These dangling bonds are in turn connected to the common type of atoms contained in the second hydrogen barrier film. Thus, the first and second hydrogen barrier films are not merely in physical contact with but in chemical connection to each other by the chemical bonding of the common type of atoms contained in the two films, so that the adhesion between the first and second hydrogen barrier films is improved. This suppresses hydrogen diffusion into the capacitor insulating film through the interface at which the first and second hydrogen barrier films come into contact with each other and thus decreases degradation of the polarization properties of the capacitor insulating film made of a ferroelectric film or a high dielectric film.

Preferably, in this case, the etching is dry etching using an inert gas.

Thus, the inert gas can be used to break the bonding between the common type of atoms contained in the first and second hydrogen barrier films while there is no occurrence of undesired chemical reaction. Thus, a number of dangling bonds can be produced in the surface of the first hydrogen barrier film.

Preferably, in the first formation method of a semiconductor device, the second hydrogen barrier film is formed by a reactive sputtering method in an atmosphere including atoms of the type commonly contained in the first and second hydrogen barrier films.

With this method, the second hydrogen barrier film is deposited while the atoms that exist in the atmosphere and are of the type commonly contained in the first and second hydrogen barrier films are taken into the contact portion between the first and second hydrogen barrier films. This improves the adhesion between the first and second hydrogen barrier films.

Preferably, in the first formation method of a semiconductor device, the atoms are nitrogen atoms or oxygen atoms.

This method can form the first and second hydrogen barrier films by a relatively easy process and improve the adhesion between the first and second hydrogen barrier films.

Preferably, in the first formation method of a semiconductor device, the step of removing an exposed surface layer of the first hydrogen barrier film is provided between the capacitor device formation step and the second hydrogen barrier film formation step, the exposed surface layer being located around the perimeter of the capacitor device.

In the first formation method of a semiconductor device, the step of exposing at least part of a region of the first hydrogen barrier film is further provided between the capacitor device formation step and the surface layer removal step, the region being located outside a region of the first hydrogen barrier film where the capacitor device is formed. If such a provision is made, the first and second hydrogen barrier films can certainly come into contact with each other even though another layer is interposed between the first hydrogen barrier film and the capacitor device. This ensures improvement of the adhesion between the first and second hydrogen barrier films.

Preferably, in the first formation method of a semiconductor device, the surface layer removal step comprises the step of cleaning the surface layer with hydrofluoric acid.

With this method, the concentration of and the cleaning time with hydrofluoric acid can be adjusted to easily remove only the surface layer.

Preferably, in the first formation method of a semiconductor device, the surface layer removal step comprises the step of removing the surface layer by dry etching with an inert gas.

This method can remove only the surface layer easily and suppress damages to the first hydrogen barrier film.

Also, to accomplish the foregoing object, a second method for fabricating a semiconductor device of the present invention is characterized by comprising the steps of: forming a first hydrogen barrier film; forming a capacitor device on the first hydrogen barrier film; and forming a second hydrogen barrier film so that the second hydrogen barrier film covers the capacitor device and comes into contact with the first hydrogen barrier film around the perimeter of the capacitor device. This method is further characterized in that the first and second hydrogen barrier films each contain metal atoms for allowing the first and second hydrogen barrier films to adhere to each other by mutual diffusion action of the metal atoms therebetween, and around the perimeter of the capacitor device, the first and second hydrogen barrier films adhere to each other by mutual diffusion action of the metal atoms therebetween.

In the second formation method of a semiconductor device, the first and second hydrogen barrier films each contain metal atoms for promoting adhesion to each other. Since metal atoms have high diffusion coefficients, they can improve the adhesion between the first and second hydrogen barrier films. In other words, the first and second hydrogen barrier films adhere to each other by the mutual diffusion action of the metal atoms therebetween. This suppresses hydrogen diffusion into the capacitor insulating film through the interface at which the first and second hydrogen barrier films come into contact with each other. As a result, degradation of the polarization properties of the capacitor insulating film made of a ferroelectric film or a high dielectric film can further be decreased.

Preferably, in the second formation method of a semiconductor device, the metal atoms are Ti or Ta.

This method can form the first and second hydrogen barrier films by a relatively easy process. Moreover, this method can improve the adhesion between the first and second hydrogen barrier films because Ti and Ta have high diffusion coefficients.

Also, to accomplish the foregoing object, a third method for fabricating a semiconductor device of the present invention is characterized by comprising the steps of: forming a first hydrogen barrier film; forming a capacitor device on the first hydrogen barrier film; oxidizing an exposed surface of the first hydrogen barrier film which is located around the perimeter of the capacitor device; and forming a second hydrogen barrier film containing oxygen so that the second hydrogen barrier film covers the capacitor device and comes into contact with the oxidized surface.

In the third formation method of a semiconductor device, the surface oxidation layer of the first hydrogen barrier film comes into contact with the second hydrogen barrier film containing oxygen atoms. The resulting oxygen bonding can improve the adhesion between the first and second hydrogen barrier films, which decreases degradation of the polarization properties of the capacitor insulating film made of a ferroelectric film or a high dielectric film.

In the third formation method of a semiconductor device, the step of exposing at least part of a region of the first hydrogen barrier film is further provided between the capacitor device formation step and the surface oxidation step, the region being located outside a region of the first hydrogen barrier film where the capacitor device is formed. If such a provision is made, the first and second hydrogen barrier films can certainly come into contact with each other even though another layer is interposed between the first hydrogen barrier film and the capacitor device. This ensures improvement of the adhesion between the first and second hydrogen barrier films.

Preferably, in the third formation method of a semiconductor device, the surface oxidation step comprises the step of performing rapid thermal process in an oxygen atmosphere.

This method can easily oxidize only the surface of the first hydrogen barrier film and suppress influences on an underlying layer of the first hydrogen barrier film.

Preferably, in the third formation method of a semiconductor device, the surface oxidation step comprises the step of exposing the surface to oxygen plasma.

Since, with this method, oxidation is performed at a low temperature, only the surface of the first hydrogen barrier film can be oxidized more readily. Moreover, influences on an underlying layer of the first hydrogen barrier film can be further suppressed.

Also, to accomplish the foregoing object, a fourth method for fabricating a semiconductor device of the present invention preferably comprises the steps of: forming a first hydrogen barrier film; forming a capacitor device on the first hydrogen barrier film; nitriding an exposed surface of the first hydrogen barrier film which is located around the perimeter of the capacitor device; and forming a second hydrogen barrier film containing nitrogen so that the second hydrogen barrier film covers the capacitor device and comes into contact with the nitrided surface.

In the fourth formation method of a semiconductor device, the surface nitriding layer of the first hydrogen barrier film comes into contact with the second hydrogen barrier film containing nitrogen atoms. The resulting nitrogen bonding can improve the adhesion between the first and second hydrogen barrier films, which decreases degradation of the polarization properties of the capacitor insulating film made of a ferroelectric film or a high dielectric film.

In the fourth formation method of a semiconductor device, the step of exposing at least part of a region of the first hydrogen barrier film is further provided between the capacitor device formation step and the surface nitriding step, the region being located outside a region of the first hydrogen barrier film where the capacitor device is formed. If such a provision is made, the first and second hydrogen barrier films can certainly come into contact with each other even though another layer is interposed between the first hydrogen barrier film and the capacitor device. This ensures improvement of the adhesion between the first and second hydrogen barrier films.

Preferably, in the fourth formation method of a semiconductor device, the surface nitriding step comprises the step of performing rapid thermal process in a nitrogen atmosphere.

This method can easily nitride only the surface of the first hydrogen barrier film and suppress influences on an underlying layer of the first hydrogen barrier film.

Preferably, in the fourth formation method of a semiconductor device, the surface nitriding step comprises the step of exposing the surface to nitrogen plasma.

Since, with this method, nitriding is performed at a low temperature, only the surface of the first hydrogen barrier film can be nitrided more readily. Moreover, influences on an underlying layer of the first hydrogen barrier film can be further suppressed.

Also, to accomplish the foregoing object, a fifth method for fabricating a semiconductor device of the present invention is characterized by comprising the steps of: forming a first hydrogen barrier film; forming a capacitor device on the first hydrogen barrier film; forming an adhesion layer in an exposed portion of the first hydrogen barrier film which is located around the perimeter of the capacitor device; and forming a second hydrogen barrier film so that the second hydrogen barrier film covers the capacitor device and comes into contact with the adhesion layer.

In the fifth formation method of a semiconductor device, the adhesion layer is formed between the first and second hydrogen barrier films to improve the adhesion between the first and second hydrogen barrier films. This decreases degradation of the polarization properties of the capacitor insulating film made of a ferroelectric film or a high dielectric film while the selection range of materials used for the first and second hydrogen barrier films is not limited at all.

In the fifth formation method of a semiconductor device, the step of exposing at least part of a region of the first hydrogen barrier film is further provided between the capacitor device formation step and the adhesion layer formation step, the region being located outside a region of the first hydrogen barrier film where the capacitor device is formed. If such a provision is made, the first and second hydrogen barrier films can certainly come into connection to each other even though another layer is interposed between the first hydrogen barrier film and the capacitor device. This ensures improvement of the adhesion between the first and second hydrogen barrier films.

Preferably, in the fifth formation method of a semiconductor device, the adhesion layer occludes hydrogen.

With this method, minute quantities of hydrogen diffused in the adhesion layer can be captured, so that hydrogen which would otherwise diffuse into the capacitor insulating film can be suppressed effectively. This further reduces degradation of the polarization properties of the capacitor insulating film made of a ferroelectric film or a high dielectric film.

Preferably, in the fifth formation method of a semiconductor device, the adhesion layer contains Ti or Ta.

In this method, since Ti and Ta have high diffusion coefficients, the adhesion between the first and second hydrogen barrier films can further be improved. Moreover, since Ti and Ta have the ability to occlude hydrogen, hydrogen that would otherwise diffuse into the capacitor insulating film can be suppressed effectively. As a result, degradation of the polarization properties of the capacitor insulating film made of a ferroelectric film or a high dielectric film can be significantly decreased.

BEST MODE FOR CARRYING OUT THE INVENTION (First Embodiment)

Figure 1:
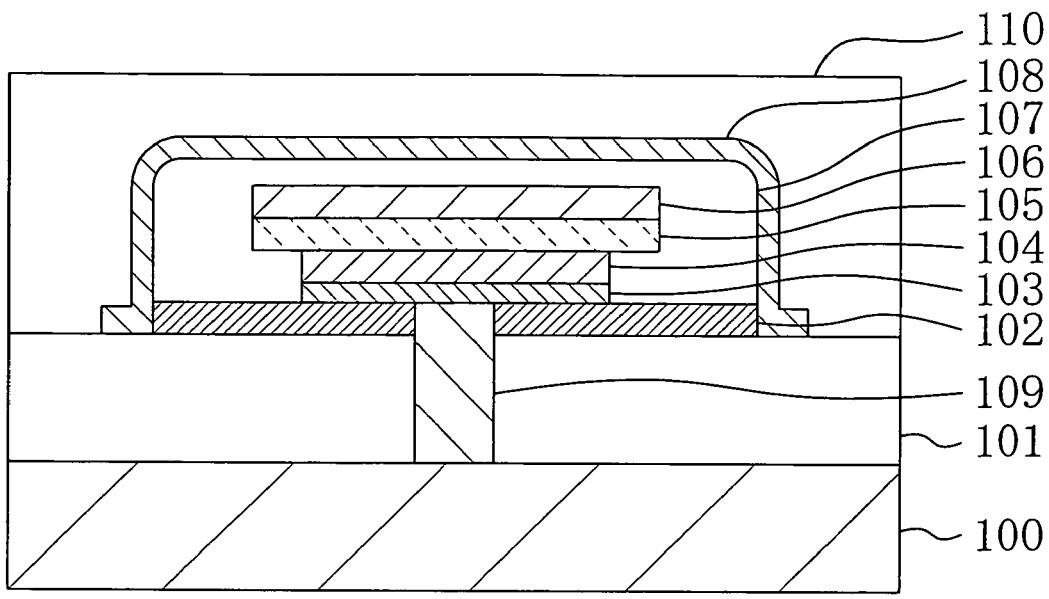
FIG. 1 is a sectional view of a semiconductor device according to a first embodiment of the present invention.

A semiconductor device according to a first embodiment of the present invention will be described below with reference to FIGS. 1 to 3. FIG. 1 shows a sectional structure of the semiconductor device according to the first embodiment.

Referring to FIG. 1, on a semiconductor substrate 100 with a memory cell transistor (its illustration is omitted) formed therein, a first interlayer insulating film 101 is formed which is composed of a BPSG film made by adding boron, phosphorus, and the like to a silicon oxide film. A first hydrogen barrier film 102 made of a silicon nitride film is formed on the first interlayer insulating film 101. A conductive second hydrogen barrier film 103 made of a titanium aluminum nitride film is formed on the first hydrogen barrier film 102. A lower electrode 104 is formed on the second hydrogen barrier film 103. The lower electrode 104 is composed of an upper film made of a platinum film and a lower film as a barrier film made of an iridium oxide film, an iridium film, a titanium aluminum nitride film, or a titanium nitride film. The lower electrode 104 may be composed of an upper film made of a platinum film and a lower film as a barrier film made of a stacked film stacking two or more films of an iridium oxide film, an iridium film, a titanium aluminum nitride film, and a titanium nitride film.

On the lower electrode 104, a capacitor insulating film 105 made of, for example, an SBT (SrTaBiO) film is formed as a ferroelectric film, and an upper electrode 106 made of a platinum film is formed on the capacitor insulating film 105. Thus, the lower electrode 104, the capacitor insulating film 105 and the upper electrode 106 constitute a ferroelectric capacitor (a capacitor device).

On the first hydrogen barrier film 102, a second interlayer insulating film 107 of an ozone-TEOS film for smoothing irregularities on the surface of the ferroelectric capacitor is formed to cover side surfaces of the second hydrogen barrier film 103 and the ferroelectric capacitor. On the first interlayer insulating film 101, a third hydrogen barrier film 108 made of a titanium aluminum nitride film is formed to cover side surfaces of the first hydrogen barrier film 102 and the second interlayer insulating film 107.

A contact plug 109 made of a W film is formed to pass through the first hydrogen barrier film 102 and the first interlayer insulating film 101. The contact plug 109 connects the semiconductor substrate 100 with arsenic or the like implanted thereinto to the lower electrode 104 of the ferroelectric capacitor via the second hydrogen barrier film 103. On the first interlayer insulating film 101, a third interlayer insulating film 110 is formed to cover the third hydrogen barrier film 108. Note that an interconnect is generally formed on the third interlayer insulating film 110.

As shown above, the ferroelectric capacitor in FIG. 1 has the structure in which the entire surrounding thereof is covered with the first, second and third hydrogen barrier films 102, 103 and 108.

A characteristic of the semiconductor device of the first embodiment having this structure is that the first and third hydrogen barrier films 102 and 108 are made of a silicon nitride film and a titanium aluminum nitride film, respectively, and that the first and third hydrogen barrier films 102 and 108 contain a common type of atoms capable of allowing these films to adhere to each other, which are nitrogen atoms in this embodiment.

Figure 2:
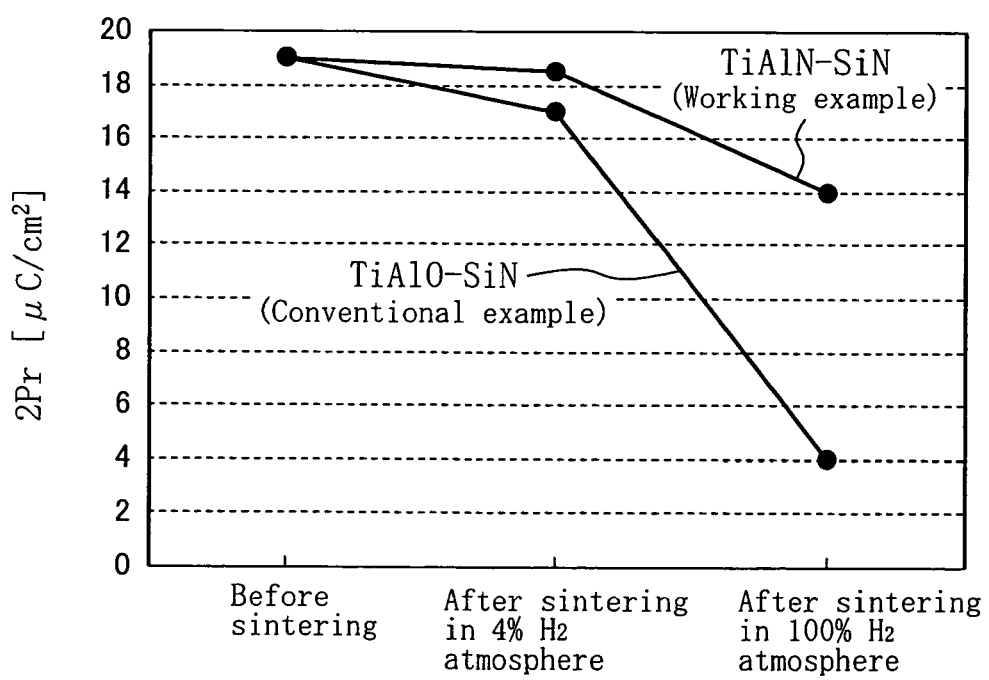
FIG. 2 is a graph showing the polarization properties of a ferroelectric film according to the first embodiment of the present invention.
Figure 13:
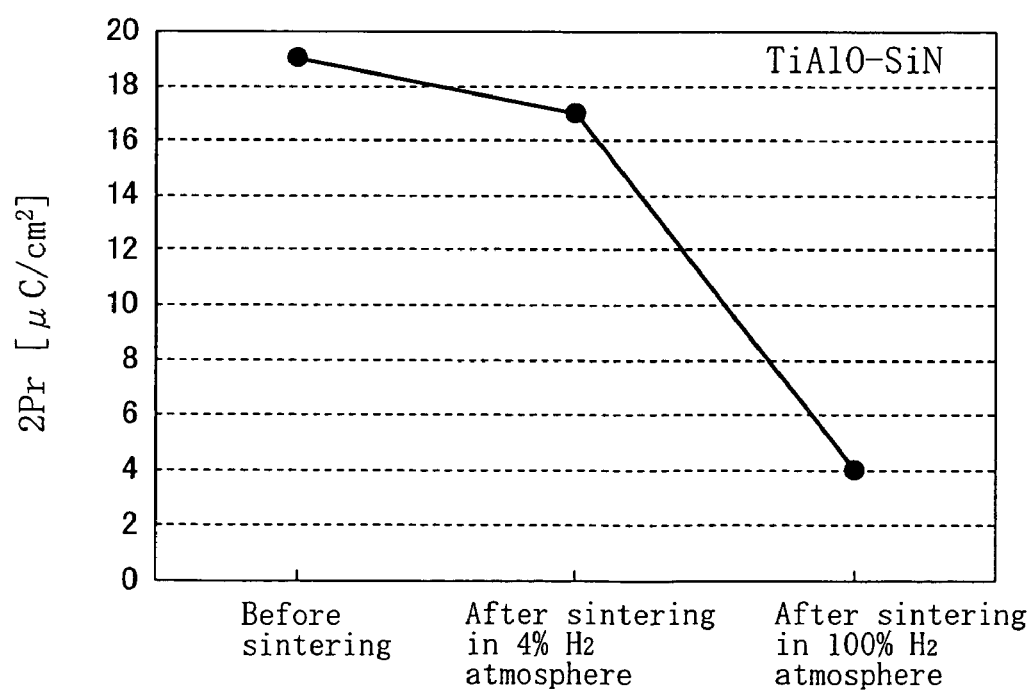
FIG. 13 is a graph showing the polarization properties of a ferroelectric film of the semiconductor device the inventors used for the subject of the experiment.
Figure 14:
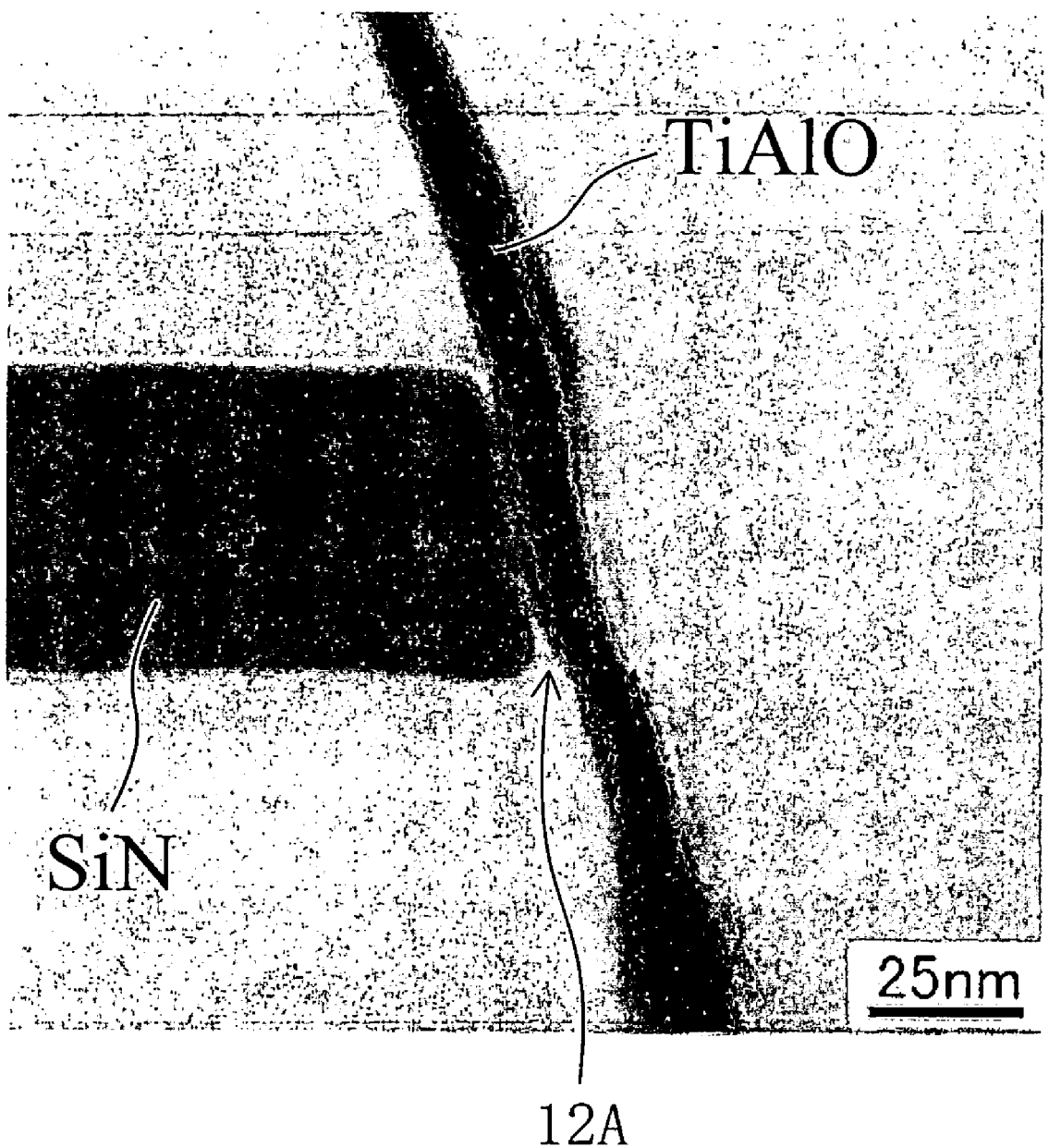
FIG. 14 is a TEM cross-sectional view showing a contact portion between hydrogen barrier films of the semiconductor device the inventors used for the subject of the experiment.
Figure 15A:
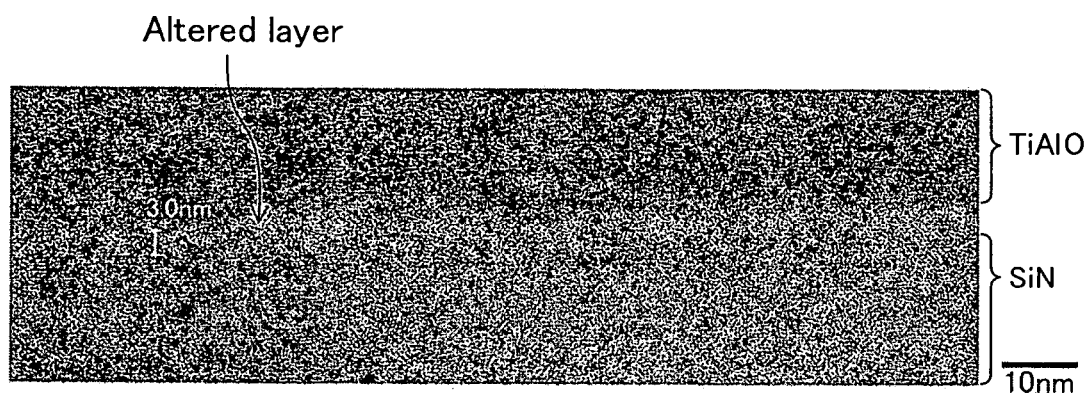
FIG. 15(a) is a TEM cross-sectional view of an experimental sample used for an analysis of a contact portion between hydrogen barrier films.
Figure 15B:
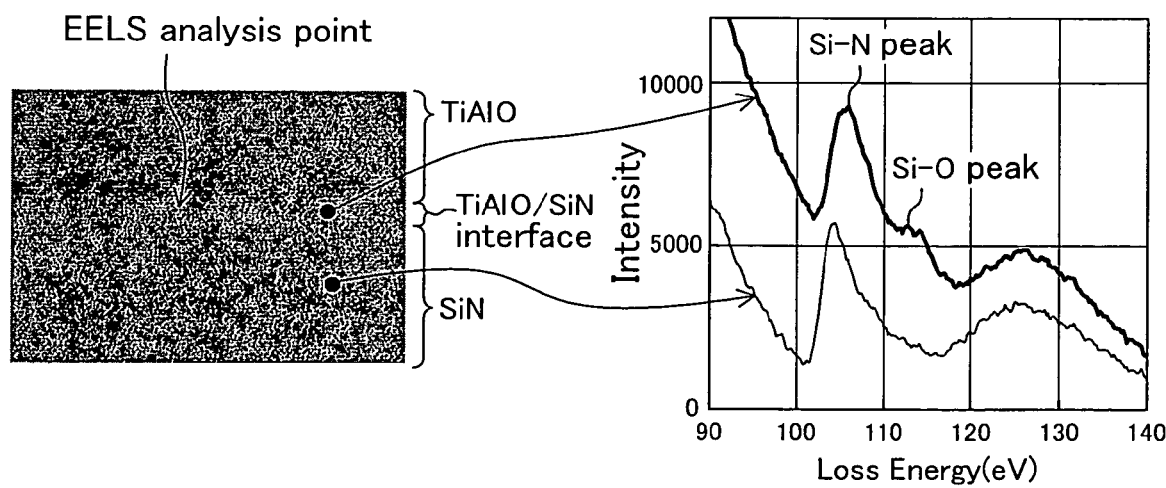
FIG. 15(b) is a TEM cross-sectional view for illustrating an EELS analysis result obtained by the experimental sample of the contact portion between the hydrogen barrier films, and a graph illustrating the relation between the loss energy and the intensity of the experimental sample.

FIG. 2 shows the polarization properties of the respective capacitor insulating films 105 made of a ferroelectric film when the ferroelectric capacitors shown in FIG. 1 are subjected to heat treatment at 400° C. for ten minutes in atmospheres containing 4% hydrogen and 100% hydrogen, respectively. In addition, FIG. 2 shows the data of FIG. 13 obtained from the conventional example.

As is apparent from FIG. 2, in the cases where the ferroelectric capacitors are subjected to heat treatment in the atmospheres containing 4% hydrogen and 100% hydrogen, respectively, degradation of the polarization properties of the capacitor insulating film 105 formed of a ferroelectric film is drastically suppressed as compared to that of the conventional example. In particular, when the ferroelectric capacitor is subjected to heat treatment in a highly reducing atmosphere as shown in the case of heat treatment in the atmosphere containing 100% hydrogen, it turned out that the extent to which the polarization properties of the capacitor insulating film 105 made of a ferroelectric film are degraded is large.

Figure 3:
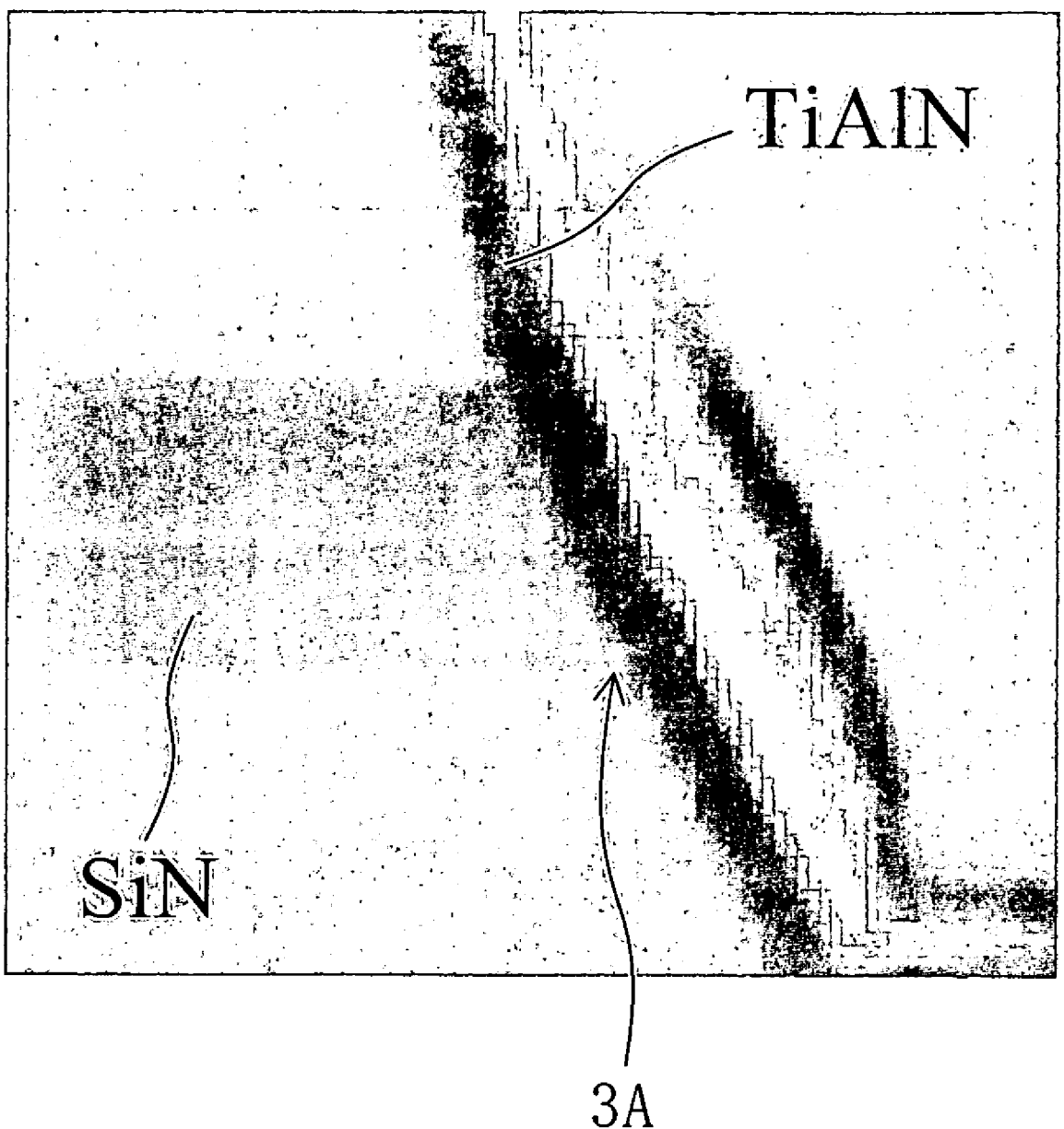
FIG. 3 is a TEM cross-sectional view showing a contact portion between hydrogen barrier films according to the first embodiment of the present invention.
Figure 12:
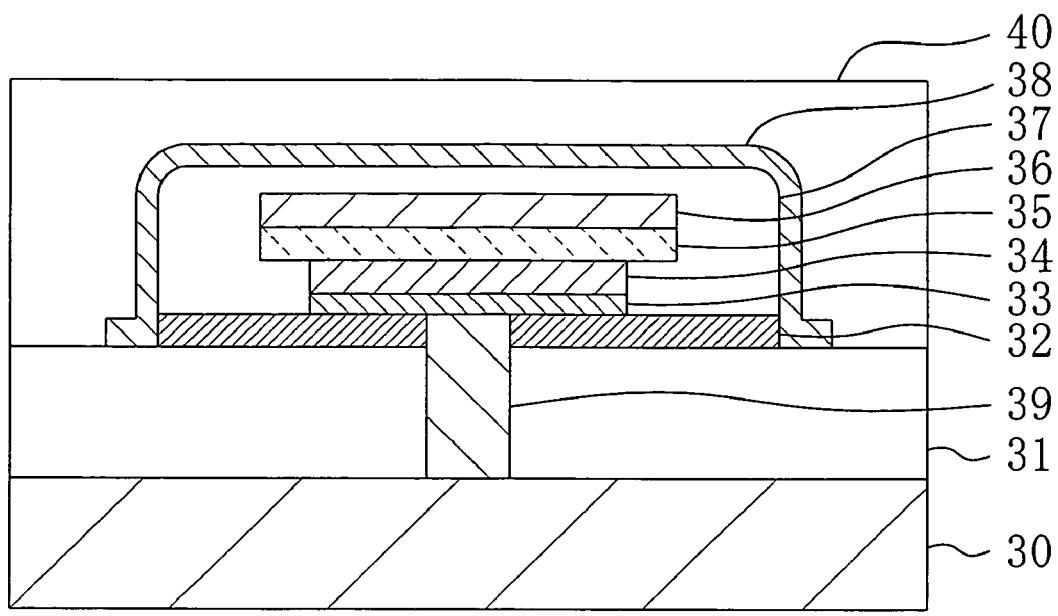
FIG. 12 is a sectional view of a semiconductor device the inventors used for a subject of an experiment.

FIG. 3 is a TEM cross-sectional view of a contact portion between the first hydrogen barrier film 102 and the third hydrogen barrier film 108 after the heat treatment at 400° C. for ten minutes in the atmosphere containing 100% hydrogen shown in FIG. 2. As is apparent from FIG. 3, the above-mentioned occurrence of a gap as shown in FIG. 12 was not observed in a contact portion 3A between the first hydrogen barrier film 102 made of a silicon nitride film and the third hydrogen barrier film 108 made of a titanium aluminum nitride film.

With this embodiment, in the portion at which the first and third hydrogen barrier films 102 and 108 come into contact with each other, the first and third hydrogen barrier films 102 and 108 are combined by covalent bonding of nitrogen. In other words, the nitrogen atom has bonds for bridging the first and third hydrogen barrier films 102 and 108 and provides cross-linkage. Therefore, the boundary region in which the first hydrogen barrier film 102 comes into contact with the third hydrogen barrier film 108 is formed with a layer of nitrogen atoms serving as an adhesion region, so that no gap is formed therebetween. Moreover, in the contact portion between the first and third hydrogen barrier films 102 and 108, no silicon oxide film is formed which serves as a hydrogen diffusion path.

From the foregoing, the inventors definitely confirmed the cause of degradation of the polarization properties of a ferroelectric film greatly depends upon the condition of the interface at which the hydrogen barrier films are in contact with each other. As a result of this confirmation, the inventors obtained the following effect. The hydrogen barrier films coming into contact with each other at the contact portion are allowed to contain a common type of atoms for promoting adhesion, thereby improving the adhesion between the hydrogen barrier films. This suppresses degradation of the polarization properties of the ferroelectric film.

As described above, in the first embodiment, the first and third hydrogen barrier films 102 and 108 contain a common type of atoms for allowing these films to adhere to each other. Therefore, the first and third hydrogen barrier films are not merely in physical contact with but in chemical connection to each other by the chemical bonding of the atoms of the common type. This improves the adhesion between the first and third hydrogen barrier films 102 and 108, which suppresses hydrogen diffusion into the capacitor insulating film 105 through the interface at which the first and third hydrogen barrier films 102 and 108 come into contact with each other. This leads to a decrease in degradation of the polarization properties of the capacitor insulating film 105 made of a ferroelectric film. Accordingly, a ferroelectric memory device exhibiting an excellent reliability can be realized.

The ferroelectric capacitor shown in FIG. 1 has the structure in which the lower electrode 104 serves as a capacitance definition unit. Alternatively, the ferroelectric capacitor may have the structure in which the upper electrode 106 serves as a capacitance definition unit.

Moreover, the first embodiment describes the case where the capacitor insulating film 105 is made of an SBT film as a ferroelectric film. Alternatively, the capacitor insulating film 105 made of a material capable of being reduced, such as a PZT-based film, a BLT-based film, a BST-based film, or a tantalum oxide film, can attain the same effect. In addition, the first embodiment describes the case where the capacitor insulating film 105 is made of a ferroelectric film. However, it goes without saying that the same effect can be exerted even in the case where the capacitor insulating film 105 is made of a high dielectric film.

Furthermore, in the first embodiment, description has been made of the case where the first and third hydrogen barrier films 102 and 108 commonly contain nitrogen atoms as the atoms of the common type for allowing these films to adhere to each other. Alternatively, using a silicon oxynitride film as the first hydrogen barrier film 102 and, for example, a titanium aluminum oxide film or an aluminum oxide film as the third hydrogen barrier film 108, the first and third hydrogen barrier films 102 and 108 are allowed to commonly contain oxygen atoms as the atoms for allowing these films to adhere to each other. This improves the adhesion between the first and third hydrogen barrier films 102 and 108 as in the case where the atom for allowing adhesion is a nitrogen atom. Such a common containment of nitrogen atoms or oxygen atoms in the first and third hydrogen barrier films 102 and 108 facilitates formation of a nitride or an oxide in performing heat treatment, plasma treatment, reactive spattering, CVD, and the like. Therefore, the flexibility in the semiconductor device fabrication process can be enhanced.

The first embodiment is not limited to the case where a silicon oxynitride film is used as the first hydrogen barrier film 102 and a titanium aluminum oxide film or an aluminum oxide film is used as the third hydrogen barrier film 108. It is sufficient to use films functioning as hydrogen barrier films and commonly containing oxygen atoms.

Moreover, the first and third hydrogen barrier films 102 and 108 may be films made of the same material. This improves the adhesion between the first hydrogen barrier film 102 and the third hydrogen barrier film 108 and eliminates influences of thermal expansion, thermal contraction, or stress variation caused by heat treatment in subsequent process steps. Therefore, the contact portion between the first and third hydrogen barrier films 102 and 108 is thermally stabilized to further decrease degradation of the polarization properties of the capacitor insulating film made of a ferroelectric film or a high dielectric film.

(Second Embodiment)

Figure 4:
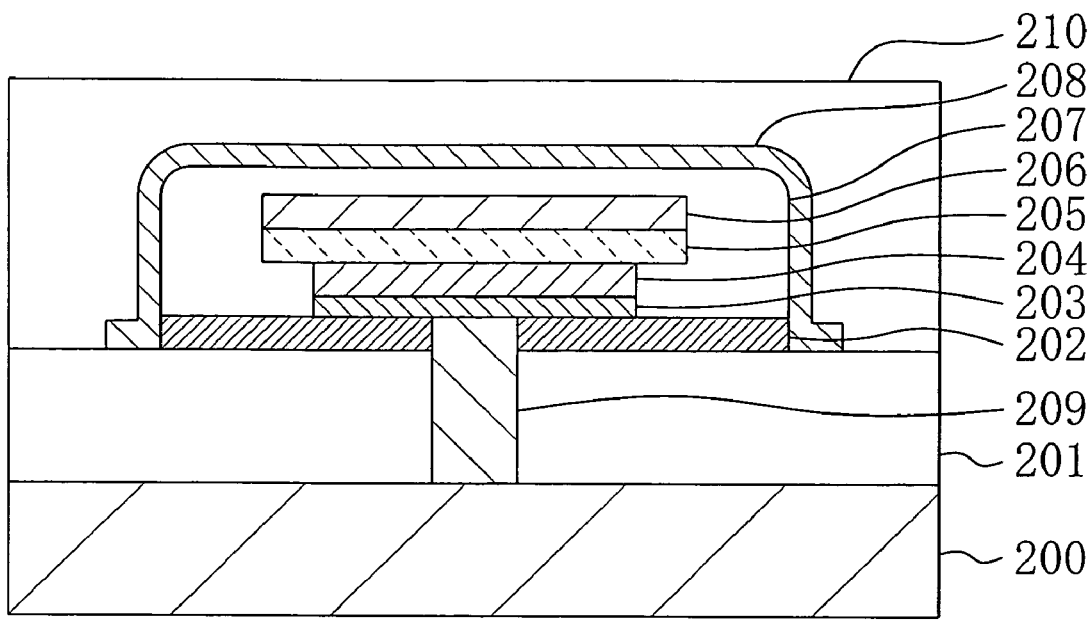
FIG. 4 is a sectional view of a semiconductor device according to a second embodiment of the present invention.

A semiconductor device according to a second embodiment of the present invention will be described below with reference to FIG. 4. FIG. 4 shows a sectional structure of the semiconductor device according to the second embodiment.

Referring to FIG. 4, on a semiconductor substrate 200 with a memory cell transistor (its illustration is omitted) formed therein, a first interlayer insulating film 201 is formed which is composed of a BPSG film made by adding boron, phosphorus, or the like to a silicon oxide film. A first hydrogen barrier film 202 made of a titanium aluminum oxide film is formed on the first interlayer insulating film 201. A conductive second hydrogen barrier film 203 made of a titanium aluminum nitride film is formed on the first hydrogen barrier film 202. A lower electrode 204 is formed on the second hydrogen barrier film 203. The lower electrode 204 is composed of an upper film made of a platinum film and a lower film as a barrier film made of an iridium oxide film, an iridium film, a titanium aluminum nitride film, or a titanium nitride film. The lower electrode 204 may be composed of an upper film made of a platinum film and a lower film as a barrier film made of a stacked film stacking two or more films of an iridium oxide film, an iridium film, a titanium aluminum nitride film, and a titanium nitride film.

On the lower electrode 204, a capacitor insulating film 205 made of, for example, an SBT (SrTaBiO) film is formed as a ferroelectric film, and an upper electrode 206 made of a platinum film is formed on the capacitor insulating film 205. Thus, the lower electrode 204, the capacitor insulating film 205 and the upper electrode 206 constitute a ferroelectric capacitor (a capacitor device).

On the first hydrogen barrier film 202, a second interlayer insulating film 207 of an ozone-TEOS film for smoothing irregularities on the surface of the ferroelectric capacitor is formed to cover side surfaces of the second hydrogen barrier film 203 and the ferroelectric capacitor. On the first interlayer insulating film 201, a third hydrogen barrier film 208 made of a tantalum nitride film is formed to cover side surfaces of the first hydrogen barrier film 202 and the second interlayer insulating film 207.

A contact plug 209 made of a W film is formed to pass through the first hydrogen barrier film 202 and the first interlayer insulating film 201. The contact plug 209 connects the semiconductor substrate 200 with arsenic or the like implanted thereinto to the lower electrode 204 of the ferroelectric capacitor via the second hydrogen barrier film 203. On the first interlayer insulating film 201, a third interlayer insulating film 210 is formed to cover the third hydrogen barrier film 208. Note that an interconnect is generally formed on the third interlayer insulating film 210.

As shown above, the ferroelectric capacitor in FIG. 4 has the structure in which the entire surrounding thereof is covered with the first, second and third hydrogen barrier films 202, 203 and 208.

A characteristic of the semiconductor device of the second embodiment having this structure is that the first and third hydrogen barrier films 202 and 208 are made of a titanium aluminum oxide film and a tantalum nitride film, respectively, and that the first and third hydrogen barrier films 202 and 208 contain metal atoms capable of allowing these films to adhere to each other by mutual diffusion action thereof, such as titanium, aluminum and tantalum. That is to say, the first hydrogen barrier films 202 and the third hydrogen barrier film 208 are allowed to commonly contain the metal atoms mentioned above, whereby the mutual diffusion action activity of the metal atoms can improve the adhesion between the first and third hydrogen barrier films 202 and 208. Moreover, since titanium and tantalum have high diffusion coefficients, the mutual diffusion action activity is promoted. This further improves the adhesion between the first and third hydrogen barrier films 202 and 208.

As described above, in the second embodiment, the existence of the metal atoms contained in the first and third hydrogen barrier films 202 and 208 causes mutual diffusion action activity, thereby improving the adhesion between the first and third hydrogen barrier films 202 and 208. This suppresses hydrogen diffusion into the capacitor insulating film 205 through the interface at which the first and third hydrogen barrier films 202 and 208 come into contact with each other. Therefore, degradation of the polarization properties of the capacitor insulating film 205 made of a ferroelectric film can be decreased. As a result, a ferroelectric memory device exhibiting an excellent reliability can be realized. Moreover, in the first and third hydrogen barrier films 202 and 208, metal atoms having broad use in a semiconductor device fabrication process can be employed as atoms for allowing these films to adhere to each other. In particular, use of titanium and tantalum brings about many advantages that the diffusion coefficient increases to provide a promoted mutual diffusion action activity.

In the second embodiment, the first and third hydrogen barrier films 202 and 208 may contain metal atoms of the common type. For example, the first hydrogen barrier film 202 may be made of titanium aluminum oxide and the third hydrogen barrier film 208 may be made of titanium aluminum nitride. In this case, metal boding of titanium which is the metal atom of the common type combines the first and third hydrogen barrier films 202 and 208 with each other, which further improves the adhesion between these films.

Furthermore, the ferroelectric capacitor shown in FIG. 4 has the structure in which the lower electrode 204 serves as a capacitance definition unit. Alternatively, the ferroelectric capacitor may have the structure in which the upper electrode 206 serves as a capacitance definition unit.

Moreover, the second embodiment describes the case where the capacitor insulating film 205 is made of an SBT film as a ferroelectric film. Alternatively, the capacitor insulating film 205 made of a material capable of being reduced, such as a PZT-based film, a BLT-based film, a BST-based film, or a tantalum oxide film, can attain the same effect. In addition, the second embodiment describes the case where the capacitor insulating film 205 is made of a ferroelectric film. However, it goes without saying that the same effect can be exerted even in the case where the capacitor insulating film 205 is made of a high dielectric film.

Furthermore, the first and third hydrogen barrier films 202 and 208 may be films made of the same material. This improves the adhesion between the first hydrogen barrier film 202 and the third hydrogen barrier film 208 and eliminates influences of thermal expansion, thermal contraction, or stress variation caused by heat treatment in subsequent process steps. Therefore, the contact portion between the first and third hydrogen barrier films 202 and 208 is thermally stabilized to further decrease degradation of the polarization properties of the capacitor insulating film made of a ferroelectric film or a high dielectric film.

(Third Embodiment)

Figure 5:
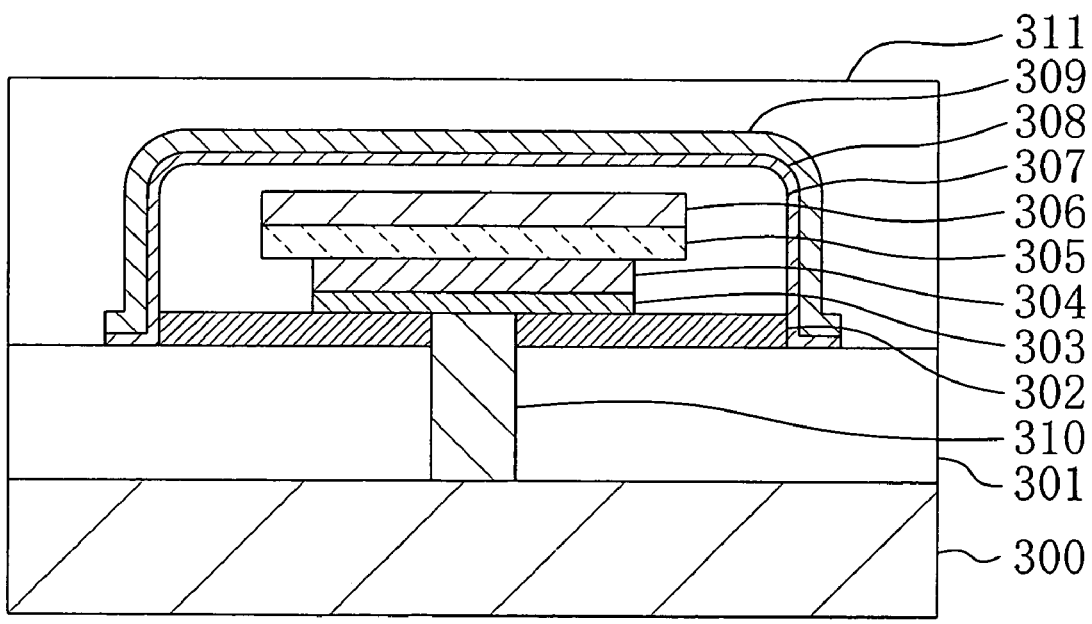
FIG. 5 is a sectional view of a semiconductor device according to a third embodiment of the present invention.

A semiconductor device according to a third embodiment of the present invention will be described below with reference to FIG. 5. FIG. 5 shows a sectional structure of the semiconductor device according to the third embodiment.

Referring to FIG. 5, on a semiconductor substrate 300 with a memory cell transistor (its illustration is omitted) formed therein, a first interlayer insulating film 301 is formed which is composed of a BPSG film made by adding boron, phosphorus, and the like to a silicon oxide film. A first hydrogen barrier film 302 made of a silicon nitride film is formed on the first interlayer insulating film 301. A conductive second hydrogen barrier film 303 made of a titanium aluminum nitride film is formed on the first hydrogen barrier film 302. A lower electrode 304 is formed on the second hydrogen barrier film 303. The lower electrode 304 is composed of an upper film made of a platinum film and a lower film as a barrier film made of an iridium oxide film, an iridium film, a titanium aluminum nitride film, or a titanium nitride film. The lower electrode 304 may be composed of an upper film made of a platinum film and a lower film as a barrier film made of a stacked film stacking two or more films of an iridium oxide film, an iridium film, a titanium aluminum nitride film, and a titanium nitride film.

On the lower electrode 304, a capacitor insulating film 305 made of, for example, an SBT (SrTaBiO) film is formed as a ferroelectric film, and an upper electrode 306 made of a platinum film is formed on the capacitor insulating film 305. Thus, the lower electrode 304, the capacitor insulating film 305 and the upper electrode 306 constitute a ferroelectric capacitor (a capacitor device).

On the first hydrogen barrier film 302, a second interlayer insulating film 307 of an ozone-TEOS film for smoothing irregularities on the surface of the ferroelectric capacitor is formed to cover side surfaces of the second hydrogen barrier film 303 and the ferroelectric capacitor. On the first interlayer insulating film 301, an adhesion layer 308 of a titanium film having a thickness of 1 to 10 nm is formed to cover side surfaces of the first hydrogen barrier film 302 and the second interlayer insulating film 307. A third hydrogen barrier film 309 made of a titanium aluminum nitride film is formed on the adhesion layer 308. Thus, the first and third hydrogen barrier films 302 and 309 are connected to each other with the adhesion layer 308 interposed therebetween.

A contact plug 310 made of a W film is formed to pass through the first hydrogen barrier film 302 and the first interlayer insulating film 301. The contact plug 310 connects the semiconductor substrate 300 with arsenic or the like implanted thereinto to the lower electrode 304 of the ferroelectric capacitor via the second hydrogen barrier film 303. On the first interlayer insulating film 301, a third interlayer insulating film 311 is formed to cover the third hydrogen barrier film 309. Note that an interconnect is generally formed on the third interlayer insulating film 311.

As shown above, the ferroelectric capacitor in FIG. 5 has the structure in which the entire surrounding thereof is covered with the first, second and third hydrogen barrier films 302, 303 and 309.

A characteristic of the semiconductor device of the third embodiment having this structure is that the adhesion layer 308 is interposed between the first and third hydrogen barrier films 302 and 309 to improve the adhesion between the first and third hydrogen barrier films 302 and 309.

As described above, in the third embodiment, the adhesion layer 308 can be interposed between the first and third hydrogen barrier films 302 and 309 to improve the adhesion between the first and third hydrogen barrier films 302 and 309. This suppresses hydrogen diffusion into the capacitor insulating film 305 while the selection range of materials used for the first and third hydrogen barrier films 302 and 309 is not limited at all. Therefore, degradation of the polarization properties of the capacitor insulating film 305 made of a ferroelectric film can be decreased. As a result, a ferroelectric memory device exhibiting an excellent reliability can be realized.

Moreover, in order to prevent hydrogen diffusion into the capacitor insulating film 305 through the adhesion layer 308, the adhesion layer 308 may contain metal of the group 3A, 4A, or 5A which belongs to transition metal, thereby utilizing the ability of this metal to occlude hydrogen. This further prevents hydrogen diffusion into the capacitor insulating film 305 through the adhesion layer 308, which further reduces degradation of the polarization properties of the capacitor insulating film 305 of a ferroelectric film. Since, in particular, titanium and tantalum have high diffusion coefficients, use of titanium or tantalum as the transition metal further promotes the effect of allowing the first and third hydrogen barrier films 302 and 309 to adhere to each other.

In the third embodiment, description has been made of the case where a silicon nitride film is used as the first hydrogen barrier film 302 and a titanium aluminum nitride film is used as the third hydrogen barrier film 309. However, the materials of the first and third hydrogen barrier films 302 and 309 are not limited to these, and it is sufficient to use materials capable of forming hydrogen barrier films.

In the third embodiment, since the adhesion layer 308 is interposed between the first and third hydrogen barrier films 302 and 309, no silicon oxide film is formed between the first hydrogen barrier film 302 and the adhesion layer 308 and between the third hydrogen barrier film 309 and the adhesion layer 308. Therefore, there is no hydrogen entry between the first and third hydrogen barrier films 302 and 309.

Furthermore, the ferroelectric capacitor shown in FIG. 5 has the structure in which the lower electrode 304 serves as a capacitance definition unit. Alternatively, the ferroelectric capacitor may have the structure in which the upper electrode 306 serves as a capacitance definition unit.

Moreover, the third embodiment describes the case where the capacitor insulating film 305 is made of an SBT film as a ferroelectric film. Alternatively, the capacitor insulating film 305 made of a material capable of being reduced, such as a PZT-based film, a BLT-based film, a BST-based film, or a tantalum oxide film, can attain the same effect. In addition, the third embodiment describes the case where the capacitor insulating film 305 is made of a ferroelectric film. However, it goes without saying that the same effect can be exerted even in the case where the capacitor insulating film 305 is made of a high dielectric film.

(Fourth Embodiment)

A method for fabricating a semiconductor device according to a fourth embodiment of the present invention will be described below with reference to FIGS. 6(a) to 6(e).

Figure 6A:
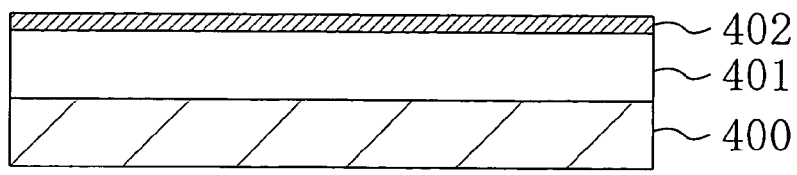
FIGS. 6(a) to 6(e) are sectional views showing a method for fabricating a semiconductor device according to a fourth embodiment of the present invention.

Referring to FIG. 6(a), on a semiconductor substrate 400 with a memory cell transistor (its illustration is omitted) formed therein, a first interlayer insulating film 401 is formed which is composed of a BPSG film made by adding boron, phosphorus, and the like to a silicon oxide film represented by $SiO_2$. Subsequently, on the first interlayer insulating film 401, a first hydrogen barrier film 402 made of a silicon nitride film is formed by plasma CVD. Although a large amount of active hydrogen is typically generated in forming, by plasma CVD, the first hydrogen barrier film 402 made of a silicon nitride film, influences of the generated active hydrogen can basically be avoided because a ferroelectric capacitor described later has not been formed yet.

Figure 6B:
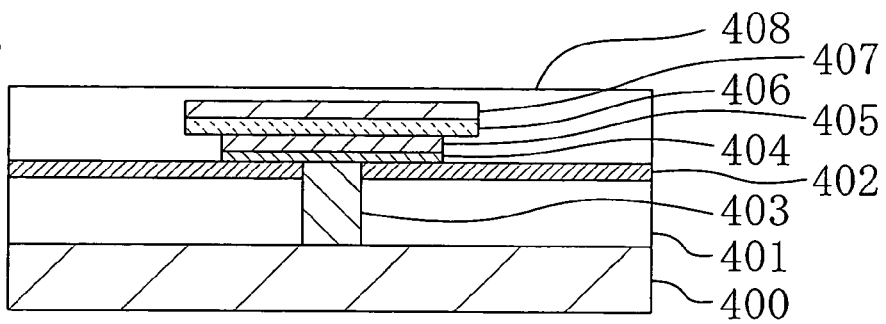

Next, as shown in FIG. 6(b), through the first interlayer insulating film 401 and the first hydrogen barrier film 402, a contact plug 403 made of a W film or a polysilicon film is formed which is connected at the lower end to the memory cell transistor. Then, a hydrogen barrier layer made of a titanium aluminum nitride film is deposited on the first hydrogen barrier film 402 and the contact plug 403, after which above the hydrogen barrier layer, a first conductive film of a platinum film for promoting crystal growth of a ferroelectric film is deposited through an oxygen barrier layer of a stacked structure made by sequentially stacking an iridium film and an iridium oxide film from bottom to top. Subsequently to this, the hydrogen barrier layer, the oxygen barrier layer and the first conductive film are patterned to form a second hydrogen barrier film 404 connected to the upper end of the contact plug 403 and a lower electrode 405.

Next, above the lower electrode 405, a ferroelectric film of an SBT film and a second conductive film of a platinum film are sequentially formed from bottom to top, after which the ferroelectric film and the second conductive film are patterned to form a capacitor insulating film 406 and an upper electrode 407. Thus, a ferroelectric capacitor (a capacitor device) is formed which is composed of the lower electrode 405, the capacitor insulating film 406, and the upper electrode 407. The contact plug 403 electrically connects the semiconductor substrate 400 to the lower electrode 405 of the ferroelectric capacitor via the second hydrogen barrier film 404. Then, on the first hydrogen barrier film 402, an insulating film 408 of an ozone-TEOS film for smoothing irregularities on the surface of the ferroelectric capacitor is deposited to cover side surfaces of the second hydrogen barrier film 404 and the ferroelectric capacitor. Note that the fabrication process of a semiconductor device described above is given as one example, and the fourth embodiment is not limited to this.

Figure 6C:
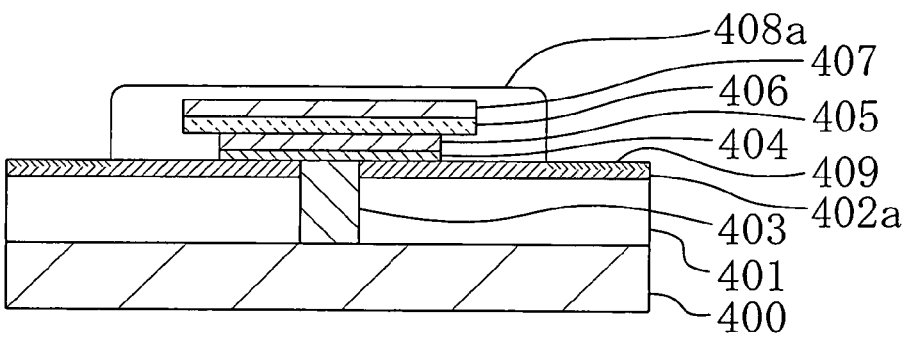

Subsequently, as shown in FIG. 6(c), the insulating film 408 is patterned to expose the surface of part of the first hydrogen barrier film 402 which is located beside the circumference of the ferroelectric capacitor (note that herein, the insulating film 408 having been patterned is referred to as an insulating film 408a and the first hydrogen barrier film 402 with the surface exposed is referred to as a first hydrogen barrier film 402a). As shown above, a surface region of the first hydrogen barrier film 402 located outside a surface region thereof where the ferroelectric capacitor is formed is at least partly exposed. This provides a reliable contact between the first hydrogen barrier film 402 and a third hydrogen barrier film 410 described below even if another layer is interposed between the first hydrogen barrier film 402 and the ferroelectric capacitor. Therefore, the adhesion between the first and third hydrogen barrier films 402 and 410 can be improved reliably.

In addition, as shown in FIG. 6(c), a surface layer 409 is created on the exposed portion of the surface of the first hydrogen barrier film 402a. To be more specific, the patterning is generally performed by dry etching or wet etching. As a result, on the exposed portion of the surface of the first hydrogen barrier film 402, as the surface layer 409, a layer is created which is made by the reaction of the first hydrogen barrier film 402 with residues of gas used in the dry etching, residues of chemical solution used in the wet etching, the etching gas used in the dry etching, or the etching chemical solution used in the wet etching, or an oxidation layer is created by ashing or the like for removing photoresist used as a mask in the patterning.

Figure 6D:
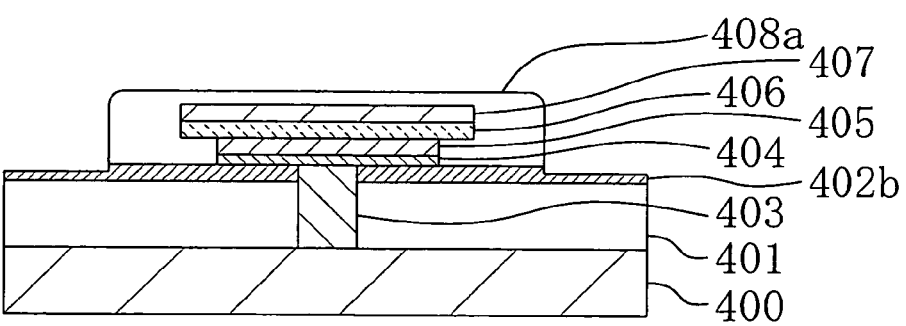

Next, as shown in FIG. 6(d), cleaning with hydrofluoric acid is performed to remove the surface layer 409 on the first hydrogen barrier film 402a (note that herein, the first hydrogen barrier film 402 with the surface layer 409 removed is referred to as a first hydrogen barrier film 402b). With this step, the concentration of and the cleaning time with hydrofluoric acid can be adjusted to easily remove only the surface layer.

Figure 6E:
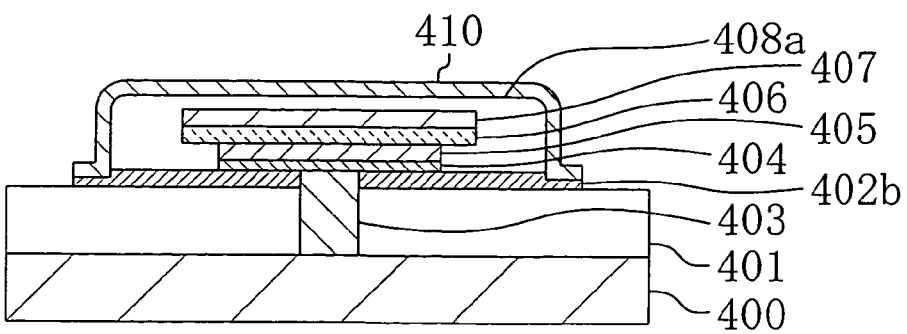

Then, as shown in FIG. 6(e), on the first hydrogen barrier film 402b with the surface layer 409 removed, a third hydrogen barrier film 410 made of a titanium aluminum nitride film is formed to cover the entire insulating film 408a. Although FIG. 6(e) shows the state in which the first and third hydrogen barrier films 402b and 410 are patterned, it is also acceptable that these films are not patterned.

As described above, in the fourth embodiment, the altered surface layer 409 is removed which is formed on the surface of the first hydrogen barrier film 402 and which causes a decrease in the adhesion between the first and third hydrogen barrier films 402 and 410, and then the first hydrogen barrier film 402 comes into contact with the third hydrogen barrier film 410. This improves the adhesion between the first and third hydrogen barrier films 402 and 410, which decreases degradation of the polarization properties of the capacitor insulating film 406 made of a ferroelectric film. Accordingly, a ferroelectric memory device exhibiting an excellent reliability can be realized.

The fourth embodiment is not limited to the first and third hydrogen barrier films 402 and 410 as long as alternatives contain a common type of atoms.

Moreover, in the fourth embodiment, when the surface layer 409 is removed, wet etching is performed using hydrofluoric acid as chemical solution. Alternatively, dry etching may be performed using plasma of an inert gas such as argon gas. With this method, the surface layer 409 alone can be removed without affecting the first hydrogen barrier film 402 even though, for example, an aluminum oxide film sensitive to damages from the wet etching using hydrofluoric acid as chemical solution is employed as the first hydrogen barrier film 402. Furthermore, even the surface layer 409 unable to be chemically removed by the wet etching using hydrofluoric acid as chemical solution can be removed by the physical approach of hitting the layer to emit the atoms therefrom.

Furthermore, in the fourth embodiment, the ferroelectric capacitor shown in, for example, FIG. 6(e) has the structure in which the lower electrode 405 serves as a capacitance definition unit. Alternatively, the ferroelectric capacitor may have the structure in which the upper electrode 407 serves as a capacitance definition unit.

Moreover, the fourth embodiment describes the case where the capacitor insulating film 406 is made of an SBT film as a ferroelectric film. Alternatively, the capacitor insulating film 406 made of a material capable of being reduced, such as a PZT-based film, a BLT-based film, a BST-based film, or a tantalum oxide film, can attain the same effect. In addition, the fourth embodiment describes the case where the capacitor insulating film 406 is made of a ferroelectric film. However, it goes without saying that the same effect can be exerted even in the case where the capacitor insulating film 406 is made of a high dielectric film.

(Fifth embodiment)

A method for fabricating a semiconductor device according to a fifth embodiment of the present invention will be described below with reference to FIGS. 7(a) to 7(e).

Figure 7A:
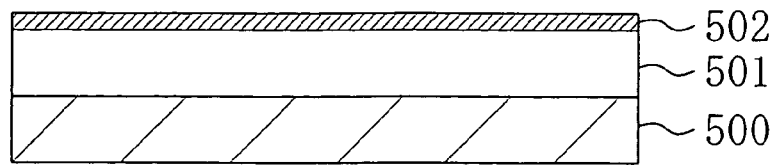
FIGS. 7(a) to 7(e) are sectional views showing a method for fabricating a semiconductor device according to a fifth embodiment of the present invention.

Referring to FIG. 7(a), on a semiconductor substrate 500 with a memory cell transistor (its illustration is omitted) formed therein, a first interlayer insulating film 501 is formed which is composed of a BPSG film made by adding boron, phosphorus, and the like to a silicon oxide film represented by $SiO_2$. Subsequently, on the first interlayer insulating film 501, a first hydrogen barrier film 502 made of a silicon nitride film is formed by plasma CVD. Although a large amount of active hydrogen is typically generated in forming, by plasma CVD, the first hydrogen barrier film 502 made of a silicon nitride film, influences of the generated active hydrogen can basically be avoided because a ferroelectric capacitor described later has not been formed yet.

Figure 7B:
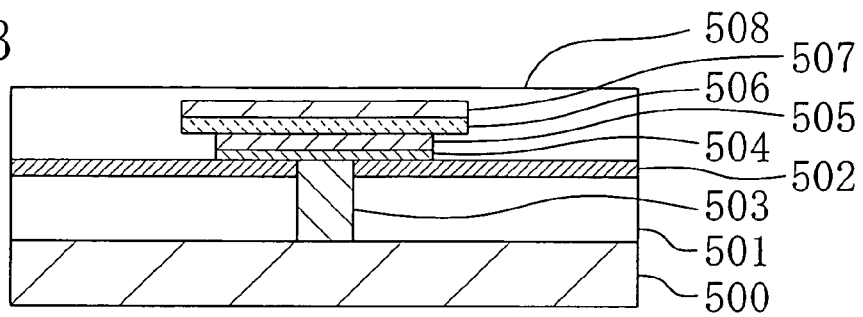

Next, as shown in FIG. 7(b), through the first interlayer insulating film 501 and the first hydrogen barrier film 502, a contact plug 503 made of a W film or a polysilicon film is formed which is connected at the lower end to the memory cell transistor. Then, a hydrogen barrier layer made of a titanium aluminum nitride film is deposited on the first hydrogen barrier film 502 and the contact plug 503, after which above the hydrogen barrier layer, a first conductive film of a platinum film for promoting crystal growth of a ferroelectric film is deposited through an oxygen barrier layer of a stacked structure made by sequentially stacking an iridium film and an iridium oxide film from bottom to top. Subsequently to this, the hydrogen barrier layer, the oxygen barrier layer and the first conductive film are patterned to form a second hydrogen barrier film 504 connected to the upper end of the contact plug 503 and a lower electrode 505.

Next, above the lower electrode 505, a ferroelectric film of an SBT film and a second conductive film of a platinum film are sequentially formed from bottom to top, after which the ferroelectric film and the second conductive film are patterned to form a capacitor insulating film 506 and an upper electrode 507. Thus, a ferroelectric capacitor (a capacitor device) is formed which is composed of the lower electrode 505, the capacitor insulating film 506, and the upper electrode 507. The contact plug 503 electrically connects the semiconductor substrate 500 to the lower electrode 505 of the ferroelectric capacitor via the second hydrogen barrier film 504. Then, on the first hydrogen barrier film 502, an insulating film 508 of an ozone-TEOS film for smoothing irregularities on the surface of the ferroelectric capacitor is deposited to cover side surfaces of the second hydrogen barrier film 504 and the ferroelectric capacitor. Note that the fabrication process of a semiconductor device described above is given as one example, and the fifth embodiment is not limited to this.

Figure 7C:
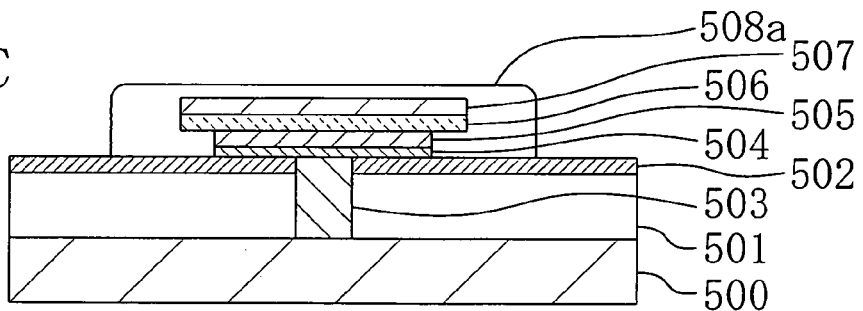

Subsequently, as shown in FIG. 7(c), the insulating film 508 is patterned to expose the surface of part of the first hydrogen barrier film 502 which is located beside the circumference of the ferroelectric capacitor (note that herein, the insulating film 508 having been patterned is referred to as an insulating film 508a). As shown above, a surface region of the first hydrogen barrier film 502 located outside a surface region thereof where the ferroelectric capacitor is formed is at least partly exposed. This provides a reliable contact between the first hydrogen barrier film 502 and a third hydrogen barrier film 510 described below even if another layer is interposed between the first hydrogen barrier film 502 and the ferroelectric capacitor. Therefore, the adhesion between the first and third hydrogen barrier films 502 and 510 can be improved reliably.

Figure 7D:
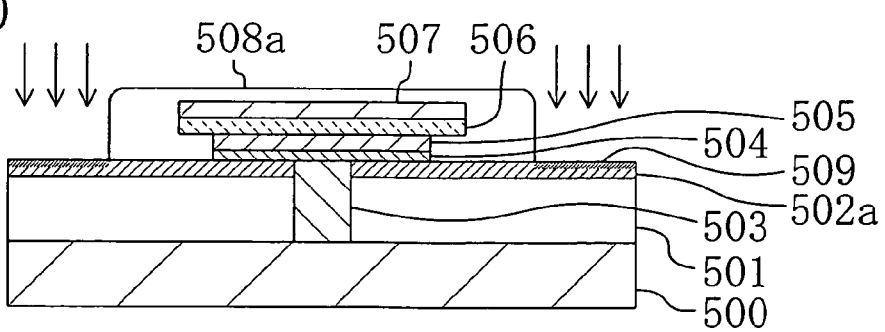

In addition, as shown in FIG. 7(d), rapid thermal process in an oxygen atmosphere is performed to form a surface oxidation layer 509 made of, for example, a silicon oxide layer represented by SiO in the surface of the first hydrogen barrier film 502 of a silicon nitride film (note that herein, the first hydrogen barrier film 502 with the surface oxidation layer 509 formed is referred to as a first hydrogen barrier film 502a). In addition, the rapid thermal process in an oxygen atmosphere is performed at a temperature ranging from 400° C. to 800° C. This oxidizes only the surface of the first hydrogen barrier film 502 to form the surface oxidation layer 509 while no damage is given to the portion of the first hydrogen barrier film 502 that will serve as an underlying layer.

Figure 7E:
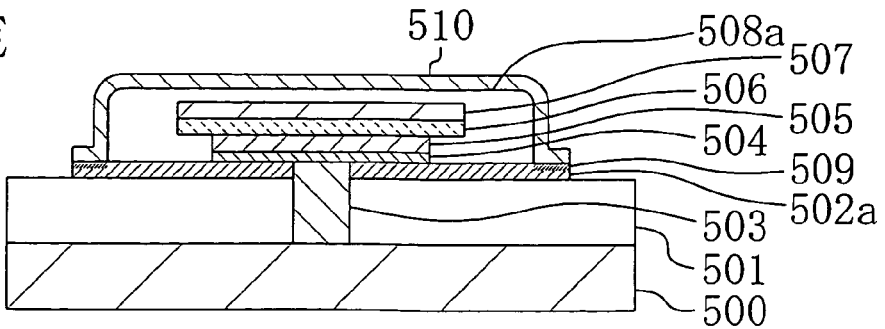

Then, as shown in FIG. 7(e), on the first hydrogen barrier film 502a, a third hydrogen barrier film 510 made of an aluminum oxide film is formed to cover the entire insulating film 508a. Although FIG. 7(e) shows the state in which the first and third hydrogen barrier films 502a and 510 are patterned, it is also acceptable that these films are not patterned.

As described above, in the fifth embodiment, the surface oxidation layer 509 made by oxidizing part of the first hydrogen barrier film 502 comes into contact with the third hydrogen barrier film 510 containing oxygen atoms for promoting the adhesion to the surface oxidation film 509. Therefore, the first and third hydrogen barrier films 502 and 510 are not merely in physical contact with but in chemical connection to each other by the chemical bonding of atoms of the common type. This improves the adhesion between the first and third hydrogen barrier films 502 and 510, which decreases degradation of the polarization properties of the capacitor insulating film 506 made of a ferroelectric film. In this case, in the portion where the first and third hydrogen barrier films 502 and 510 come into contact with each other, the oxygen atoms serve to bridges and allow the first and third hydrogen barrier films 502 and 510 to adhere to each other. As a result, no oxide film is formed which functions as a hydrogen diffusion path.

Moreover, in the fifth embodiment, when part of the surface of the first hydrogen barrier film 502 is oxidized to form the surface oxidation layer 509, the rapid thermal process in an oxygen atmosphere is performed. Alternatively, the surface oxidation layer 509 may be formed by exposing this part to oxygen plasma. With this method, the surface oxidation layer 509 can be formed at a low temperature ranging from 300° C. to 600° C., so that damages to the portion of the first hydrogen barrier film 502 that will serve as an underlying layer can be further reduced.

Also, in the fifth embodiment, description has been made of the case where part of the surface of the first hydrogen barrier film 502 is oxidized to form the surface oxidation layer 509 and then the surface oxidation layer 509 comes into contact with the third hydrogen barrier film 510 containing oxygen atoms to improve the adhesion between the first and third hydrogen barrier films 502 and 510. Likewise, even in the case where using, for example, a titanium aluminum oxide film as the first hydrogen barrier film 502, the surface thereof is nitrided to form a surface nitriding layer and then the surface nitriding layer comes into contact with the third hydrogen barrier film 510 made of a film containing nitrogen, such as a titanium aluminum nitride film, the adhesion between the first and third hydrogen barrier films 502 and 510 can be improved because nitrogen atoms contained in the third hydrogen barrier film 510 have the property of promoting the adhesion to the surface nitriding layer.

Furthermore, in the fifth embodiment, the ferroelectric capacitor shown in, for example, FIG. 7(e) has the structure in which the lower electrode 505 serves as a capacitance definition unit. Alternatively, the ferroelectric capacitor may have the structure in which the upper electrode 507 serves as a capacitance definition unit.

Moreover, the fifth embodiment describes the case where the capacitor insulating film 506 is made of an SBT film as a ferroelectric film. Alternatively, the capacitor insulating film 506 made of a material capable of being reduced, such as a PZT-based film, a BLT-based film, a BST-based film, or a tantalum oxide film, can attain the same effect. In addition, the fifth embodiment describes the case where the capacitor insulating film 506 is made of a ferroelectric film. However, it goes without saying that the same effect can be exerted even in the case where the capacitor insulating film 506 is made of a high dielectric film.

(Sixth Embodiment)

A method for fabricating a semiconductor device according to a sixth embodiment of the present invention will be described below with reference to FIGS. 8(a) to 8(e).

Figure 8A:
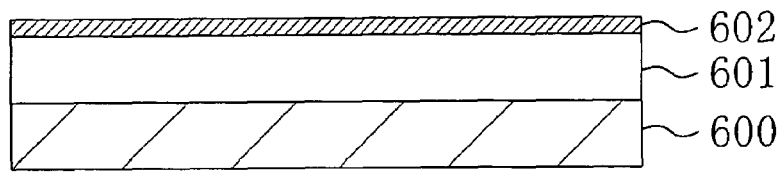
FIGS. 8(a) to 8(e) are sectional views showing a method for fabricating a semiconductor device according to a sixth embodiment of the present invention.

Referring to FIG. 8(a), on a semiconductor substrate 600 with a memory cell transistor (its illustration is omitted) formed therein, a first interlayer insulating film 601 is formed which is composed of a BPSG film made by adding boron, phosphorus, and the like to a silicon oxide film represented by $SiO_2$. Subsequently, on the first interlayer insulating film 601, a first hydrogen barrier film 602 made of a silicon nitride film is formed by plasma CVD. Although a large amount of active hydrogen is typically generated in forming, by plasma CVD, the first hydrogen barrier film 602 made of a silicon nitride film, influences of the generated active hydrogen can basically be avoided because a ferroelectric capacitor described later has not been formed yet.

Figure 8B:
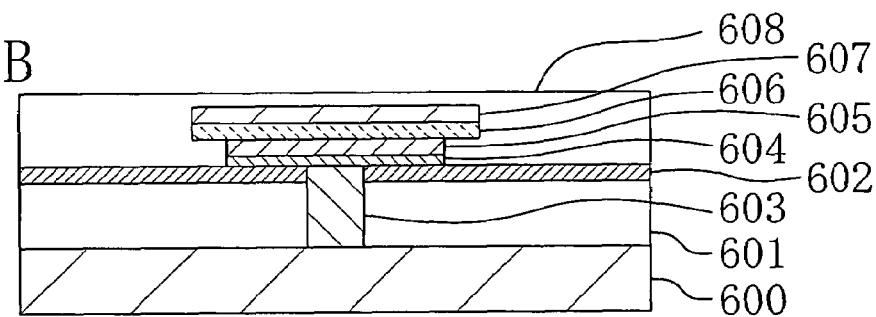

Next, as shown in FIG. 8(b), through the first interlayer insulating film 601 and the first hydrogen barrier film 602, a contact plug 603 made of a W film or a polysilicon film is formed which is connected at the lower end to the memory cell transistor. Then, a hydrogen barrier layer made of a titanium aluminum nitride film is deposited on the first hydrogen barrier film 602 and the contact plug 603, after which above the hydrogen barrier layer, a first conductive film of a platinum film for promoting crystal growth of a ferroelectric film is deposited through an oxygen barrier layer of a stacked structure made by sequentially stacking an iridium film and an iridium oxide film from bottom to top. Subsequently to this, the hydrogen barrier layer, the oxygen barrier layer and the first conductive film are patterned to form a second hydrogen barrier film 604 connected to the upper end of the contact plug 603 and a lower electrode 605.

Next, above the lower electrode 605, a ferroelectric film of an SBT film and a second conductive film of a platinum film are sequentially formed from bottom to top, after which the ferroelectric film and the second conductive film are patterned to form a capacitor insulating film 606 and an upper electrode 607. Thus, a ferroelectric capacitor is formed which is composed of the lower electrode 605, the capacitor insulating film 606, and the upper electrode 607. The contact plug 603 electrically connects the semiconductor substrate 600 to the lower electrode 605 of the ferroelectric capacitor via the second hydrogen barrier film 604. Then, on the first hydrogen barrier film 602, an insulating film 608 of an ozone-TEOS film for smoothing irregularities on the surface of the ferroelectric capacitor is deposited to cover side surfaces of the second hydrogen barrier film 604 and the ferroelectric capacitor. Note that the fabrication process of a semiconductor device described above is given as one example, and the sixth embodiment is not limited to this.

Figure 8C:
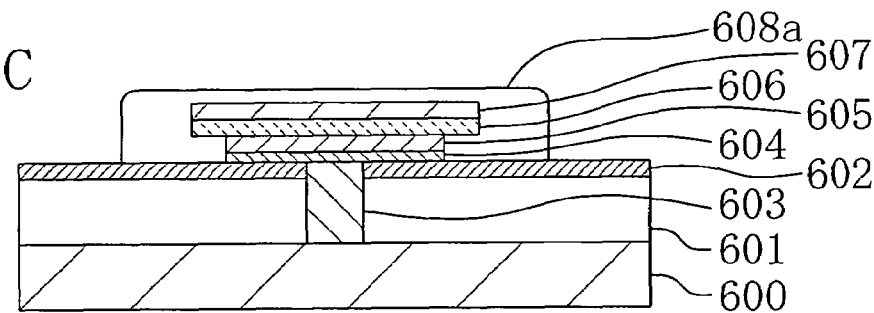

Subsequently, as shown in FIG. 8(c), the insulating film 608 is patterned to expose the surface of part of the first hydrogen barrier film 602 which is located beside the circumference of the ferroelectric capacitor (note that herein, the insulating film 608 having been patterned is referred to as an insulating film 608a). As shown above, a surface region of the first hydrogen barrier film 602 located outside a surface region thereof in which the ferroelectric capacitor is formed is at least partly exposed. This provides a reliable contact between the first hydrogen barrier film 602 and a third hydrogen barrier film 610 described below even if another layer is interposed between the first hydrogen barrier film 602 and the ferroelectric capacitor. Therefore, the adhesion between the first and third hydrogen barrier films 602 and 610 can be improved reliably.

Figure 8D:
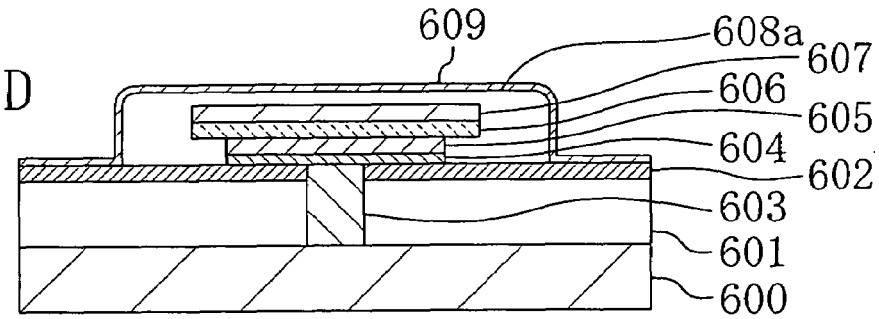

Next, as shown in FIG. 8(d), on the first hydrogen barrier film 602, an adhesion layer 609 made of a titanium film is formed to cover the insulating film 608a.

Figure 8E:
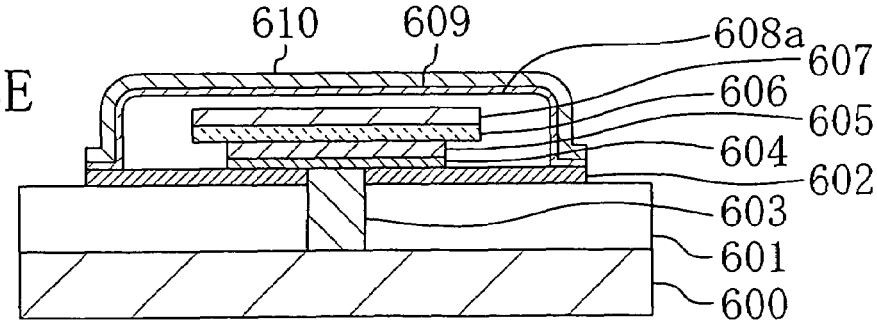

Then, as shown in FIG. 8(e), the third hydrogen barrier film 610 made of a titanium aluminum nitride film is formed on the adhesion layer 609. Although FIG. 8(e) shows the state in which the first hydrogen barrier film 602, the adhesion layer 609 and the third hydrogen barrier film 610 are patterned, it is also acceptable that these films are not patterned.

As described above, in the sixth embodiment, the adhesion layer 609 is formed between the first and third hydrogen barrier films 602 and 610, which improves the adhesion between the first and third hydrogen barrier films 602 and 610. Therefore, degradation of the polarization properties of the capacitor insulating film 606 made of a ferroelectric film can be decreased while the selection range of materials used for the first and third hydrogen barrier films 602 and 610 is not limited at all.

Moreover, in order to prevent hydrogen diffusion into the capacitor insulating film 606 through the adhesion layer 609, the adhesion layer 609 may contain metal of the group 3A, 4A, or 5A which belongs to transition metal, thereby utilizing the ability of this metal to occlude hydrogen. This further prevents hydrogen diffusion into the capacitor insulating film 606 through the adhesion layer 609, which further reduces degradation of the polarization properties of the capacitor insulating film 606 of a ferroelectric film. Since, in particular, titanium and tantalum have high diffusion coefficients, use of titanium or tantalum as the transition metal further promotes the effect of allowing the first and third hydrogen barrier films 602 and 610 to adhere to each other by mutual diffusion action of the used metal between the adhesion layer 609 and the first and third hydrogen barrier films 602 and 610.

In the sixth embodiment, description has been made of the case where a silicon nitride film is used as the first hydrogen barrier film 602 and a titanium aluminum nitride film is used as the third hydrogen barrier film 610. However, the materials of the first and third hydrogen barrier films 602 and 610 are not limited to these, and it is sufficient to use materials capable of forming hydrogen barrier films.

Furthermore, in the sixth embodiment, the ferroelectric capacitor shown in, for example, FIG. 8(e) has the structure in which the lower electrode 605 serves as a capacitance definition unit. Alternatively, the ferroelectric capacitor may have the structure in which the upper electrode 607 serves as a capacitance definition unit.

Moreover, the sixth embodiment describes the case where the capacitor insulating film 606 is made of an SBT film as a ferroelectric film. Alternatively, the capacitor insulating film 606 made of a material capable of being reduced, such as a PZT-based film, a BLT-based film, a BST-based film, or a tantalum oxide film, can attain the same effect. In addition, the sixth embodiment describes the case where the capacitor insulating film 606 is made of a ferroelectric film. However, it goes without saying that the same effect can be exerted even in the case where the capacitor insulating film 606 is made of a high dielectric film.

(Seventh Embodiment)

A method for fabricating a semiconductor device according to a seventh embodiment of the present invention will be described below with reference to FIGS. 9(a) to 9(e).

Figure 9A:
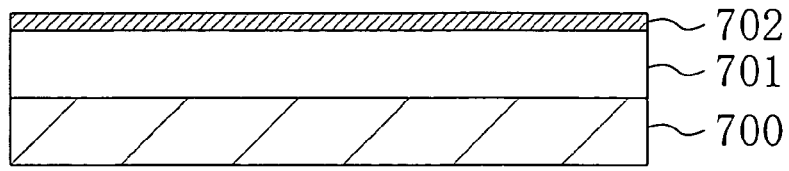
FIGS. 9(a) to 9(e) are sectional views showing a method for fabricating a semiconductor device according to a seventh embodiment of the present invention.

Referring to FIG. 9(a), on a semiconductor substrate 700 with a memory cell transistor (its illustration is omitted) formed therein, a first interlayer insulating film 701 is formed which is composed of a BPSG film made by adding boron, phosphorus, and the like to a silicon oxide film represented by $SiO_2$. Subsequently, on the first interlayer insulating film 701, a first hydrogen barrier film 702 made of a silicon nitride film is formed by plasma CVD. Although a large amount of active hydrogen is typically generated in forming, by plasma CVD, the first hydrogen barrier film 702 made of a silicon nitride film, influences of the generated active hydrogen can basically be avoided because a ferroelectric capacitor described later has not been formed yet.

Figure 9B:
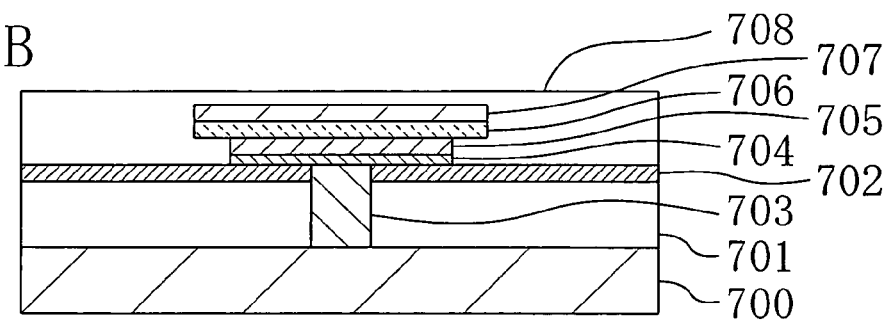
Figure 9C:
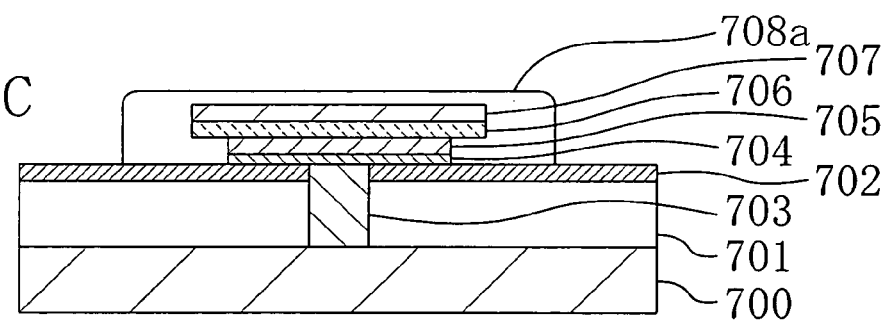
Figure 9D:
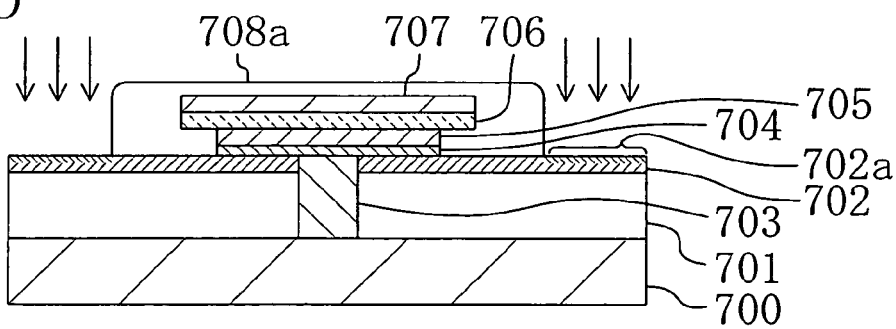
Figure 9E:
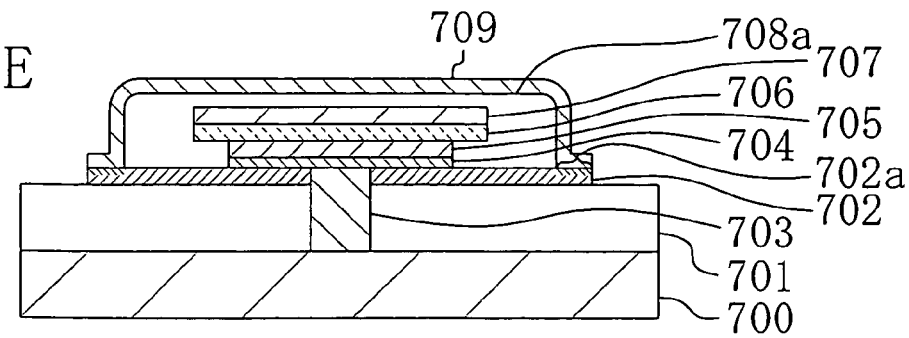

Next, as shown in FIG. 9(b), through the first interlayer insulating film 701 and the first hydrogen barrier film 702, a contact plug 703 made of a W film or a polysilicon film is formed which is connected at the lower end to the memory cell transistor. Then, a hydrogen barrier layer made of a titanium aluminum nitride film is deposited on the first hydrogen barrier film 702 and the contact plug 703, after which above the hydrogen barrier layer, a first conductive film of a platinum film for promoting crystal growth of a ferroelectric film is deposited through an oxygen barrier layer of a stacked structure made by sequentially stacking an iridium film and an iridium oxide film from bottom to top. Subsequently to this, the hydrogen barrier layer, the oxygen barrier layer and the first conductive film are patterned to form a second hydrogen barrier film 704 connected to the upper end of the contact plug 703 and a lower electrode 705.

Next, above the lower electrode 705, a ferroelectric film of an SBT film and a second conductive film of a platinum film are sequentially formed from bottom to top, after which the ferroelectric film and the second conductive film are patterned to form a capacitor insulating film 706 and an upper electrode 707. Thus, a ferroelectric capacitor is formed which is composed of the lower electrode 705, the capacitor insulating film 706, and the upper electrode 707. The contact plug 703 electrically connects the semiconductor substrate 700 to the lower electrode 705 of the ferroelectric capacitor via the second hydrogen barrier film 704. Then, on the first hydrogen barrier film 702, an insulating film 708 of an ozone-TEOS film for smoothing irregularities on the surface of the ferroelectric capacitor is deposited to cover side surfaces of the second hydrogen barrier film 704 and the ferroelectric capacitor. Note that the fabrication process of a semiconductor device described above is given as one example, and the seventh embodiment is not limited to this.

Subsequently, as shown in FIG. 9(*c*), the insulating film 708 is patterned to expose the surface of part of the first hydrogen barrier film 702 which is located beside the circumference of the ferroelectric capacitor (note that herein, the insulating film 708 having been patterned is referred to as an insulating film 708*a*). As shown above, a surface region of the first hydrogen barrier film 702 located outside a surface region thereof in which the ferroelectric capacitor is formed is at least partly exposed. This provides a reliable contact between the first hydrogen barrier film 702 and a later-described third hydrogen barrier film 709 of, for example, a titanium aluminum nitride film even if another layer is interposed between the first hydrogen barrier film 702 and the ferroelectric capacitor. Therefore, the adhesion between the first and third hydrogen barrier films 702 and 709 can be improved reliably.

Next, as shown in FIG. 9(*d*), the exposed part of the surface of the first hydrogen barrier film 702 is dry etched using an inert gas such as argon or nitrogen. By this etching, atoms of the type (nitrogen atoms in this embodiment) commonly contained in the first and third hydrogen barrier films 702 and 709 dissociate their bonds in combination with other atoms contained in the first hydrogen barrier film 702. As a result, dangling bonds (the bonds of nitrogen atoms in this embodiment) increase in the exposed region 702*a* of the surface of the first hydrogen barrier film 702.

Then, as shown in FIG. 9(*e*), by spattering, a third hydrogen barrier film 709 made of a titanium aluminum nitride film is formed to cover the region 702*a* of the surface of the first hydrogen barrier film 702. Although FIG. 9(*e*) shows the state in which the first and third hydrogen barrier films 702 and 709 are patterned, it is also acceptable that these films are not patterned.

As described above, in the seventh embodiment, in the exposed region of the surface of the first hydrogen barrier film 702, by the etching, the atoms of the type commonly contained in the first and third hydrogen barrier films 702 and 709 dissociate their bonds in combination with other atoms contained in the first hydrogen barrier film 702, and thus the dissociated bonds become dangling bonds. Therefore, the first and third hydrogen barrier films 702 and 709 are not merely in physical contact with but in chemically-bonded connection to each other. This improves the adhesion between the first hydrogen barrier film 702 and the subsequently formed third hydrogen barrier film 709, which decreases degradation of the polarization properties of the capacitor insulating film 706 made of a ferroelectric film or a high dielectric film. Moreover, in this case, no silicon oxide film functioning as a hydrogen diffusion path is formed in the contact portion between the first and third hydrogen barrier films 702 and 709.

In the seventh embodiment, description has been made of the case where a silicon nitride film is used as the first hydrogen barrier film 702 and a titanium aluminum nitride film is used as the third hydrogen barrier film 709. However, the materials of the first and third hydrogen barrier films 702 and 709 are not limited to these, and it is sufficient to use materials capable of forming hydrogen barrier films.

Furthermore, in the seventh embodiment, the ferroelectric capacitor shown in, for example, FIG. 9(*e*) has the structure in which the lower electrode 705 serves as a capacitance definition unit. Alternatively, the ferroelectric capacitor may have the structure in which the upper electrode 707 serves as a capacitance definition unit.

Moreover, the seventh embodiment describes the case where the capacitor insulating film 706 is made of an SBT film as a ferroelectric film. Alternatively, the capacitor insulating film 706 made of a material capable of being reduced, such as a PZT-based film, a BLT-based film, a BST-based film, or a tantalum oxide film, can attain the same effect. In addition, the seventh embodiment describes the case where the capacitor insulating film 706 is made of a ferroelectric film. However, it goes without saying that the same effect can be exerted even in the case where the capacitor insulating film 706 is made of a high dielectric film.

(Eighth Embodiment)

A method for fabricating a semiconductor device according to an eighth embodiment of the present invention will be described below with reference to FIGS. 10(*a*) to 10(*e*).

Referring to FIG. 10(*a*), on a semiconductor substrate 800 with a memory cell transistor (its illustration is omitted) formed therein, a first interlayer insulating film 801 is formed which is composed of a BPSG film made by adding boron, phosphorus, and the like to a silicon oxide film represented by $SiO_2$. Subsequently, on the first interlayer insulating film 801, a first hydrogen barrier film 802 made of a silicon nitride film is formed by plasma CVD. Although a large amount of active hydrogen is typically generated in forming, by plasma CVD, the first hydrogen barrier film 802 made of a silicon nitride film, influences of the generated active hydrogen can basically be avoided because a ferroelectric capacitor described later has not been formed yet.

Next, as shown in FIG. 10(*b*), through the first interlayer insulating film 801 and the first hydrogen barrier film 802, a contact plug 803 made of a W film or a polysilicon film is formed which is connected at the lower end to the memory cell transistor. Then, a hydrogen barrier layer made of a titanium aluminum nitride film is deposited on the first hydrogen barrier film 802 and the contact plug 803, after which above the hydrogen barrier layer, a first conductive film of a platinum film for promoting crystal growth of a ferroelectric film is deposited through an oxygen barrier layer of a stacked structure made by sequentially stacking an iridium film and an iridium oxide film from bottom to top. Subsequently to this, the hydrogen barrier layer, the oxygen barrier layer and the first conductive film are patterned to form a second hydrogen barrier film 804 connected to the upper end of the contact plug 803 and a lower electrode 805.

Next, above the lower electrode 805, a ferroelectric film of an SBT film and a second conductive film of a platinum film are sequentially formed from bottom to top, after which the ferroelectric film and the second conductive film are patterned to form a capacitor insulating film 806 and an upper electrode 807. Thus, a ferroelectric capacitor is formed which is composed of the lower electrode 805, the capacitor insulating film 806, and the upper electrode 807. The contact plug 803 electrically connects the semiconductor substrate 800 to the lower electrode 805 of the ferroelectric capacitor via the second hydrogen barrier film 804. Then, on the first hydrogen barrier film 802, an insulating film 808 of an ozone-TEOS film for smoothing irregularities on the surface of the ferroelectric capacitor is deposited to cover side surfaces of the second hydrogen barrier film 804 and the ferroelectric capacitor. Note that the fabrication process of a semiconductor device described above is given as one example, and the eighth embodiment is not limited to this.

Figure 10A:
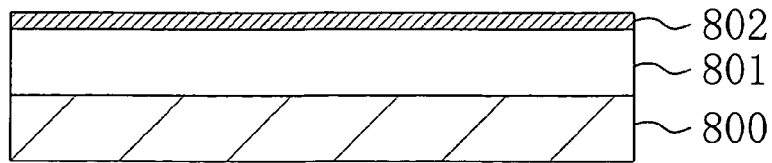
FIGS. 10(a) to 10(e) are sectional views showing a method for fabricating a semiconductor device according to an eighth embodiment of the present invention.
Figure 10B:
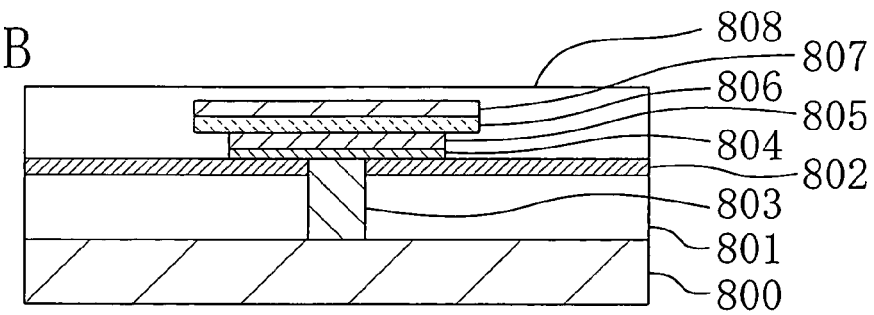
Figure 10C:
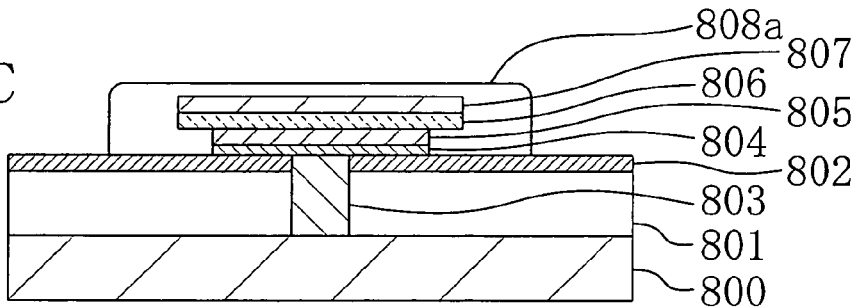

Subsequently, as shown in FIG. 10(c), the insulating film 808 is patterned to expose the surface of part of the first hydrogen barrier film 802 which is located beside the circumference of the ferroelectric capacitor (note that herein, the insulating film 808 having been patterned is referred to as an insulating film 808a). As shown above, a surface region of the first hydrogen barrier film 802 located outside a surface region thereof in which the ferroelectric capacitor is formed is at least partly exposed. This provides a reliable contact between the first hydrogen barrier film 802 and a later-described third hydrogen barrier film 809 of, for example, a titanium aluminum nitride film even if another layer is interposed between the first hydrogen barrier film 802 and the ferroelectric capacitor. Therefore, the adhesion between the first and third hydrogen barrier films 802 and 809 can be improved reliably.

Figure 10D:
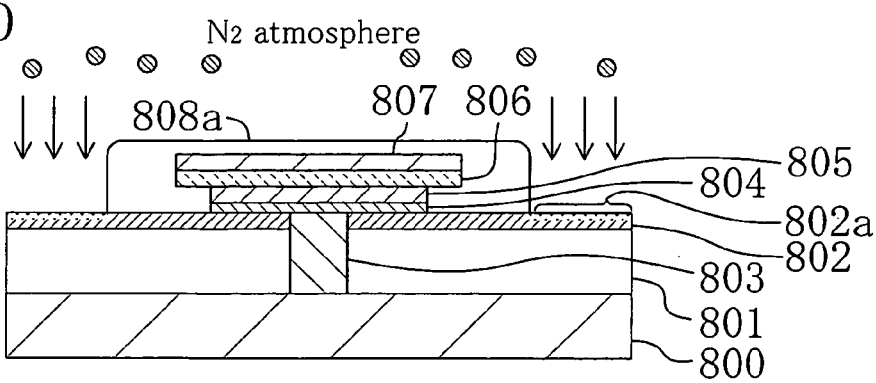
Figure 10E:
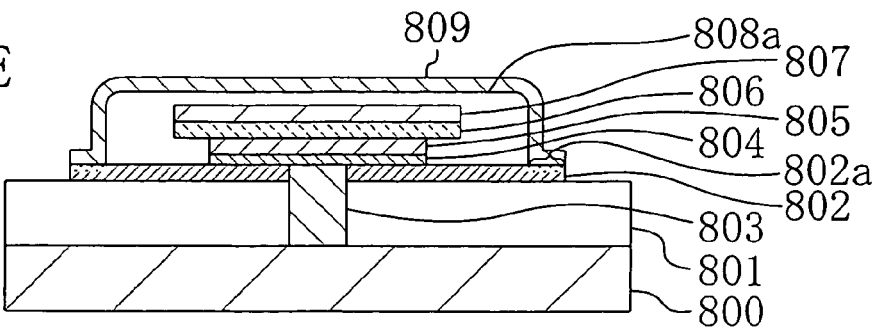
Figure 11:
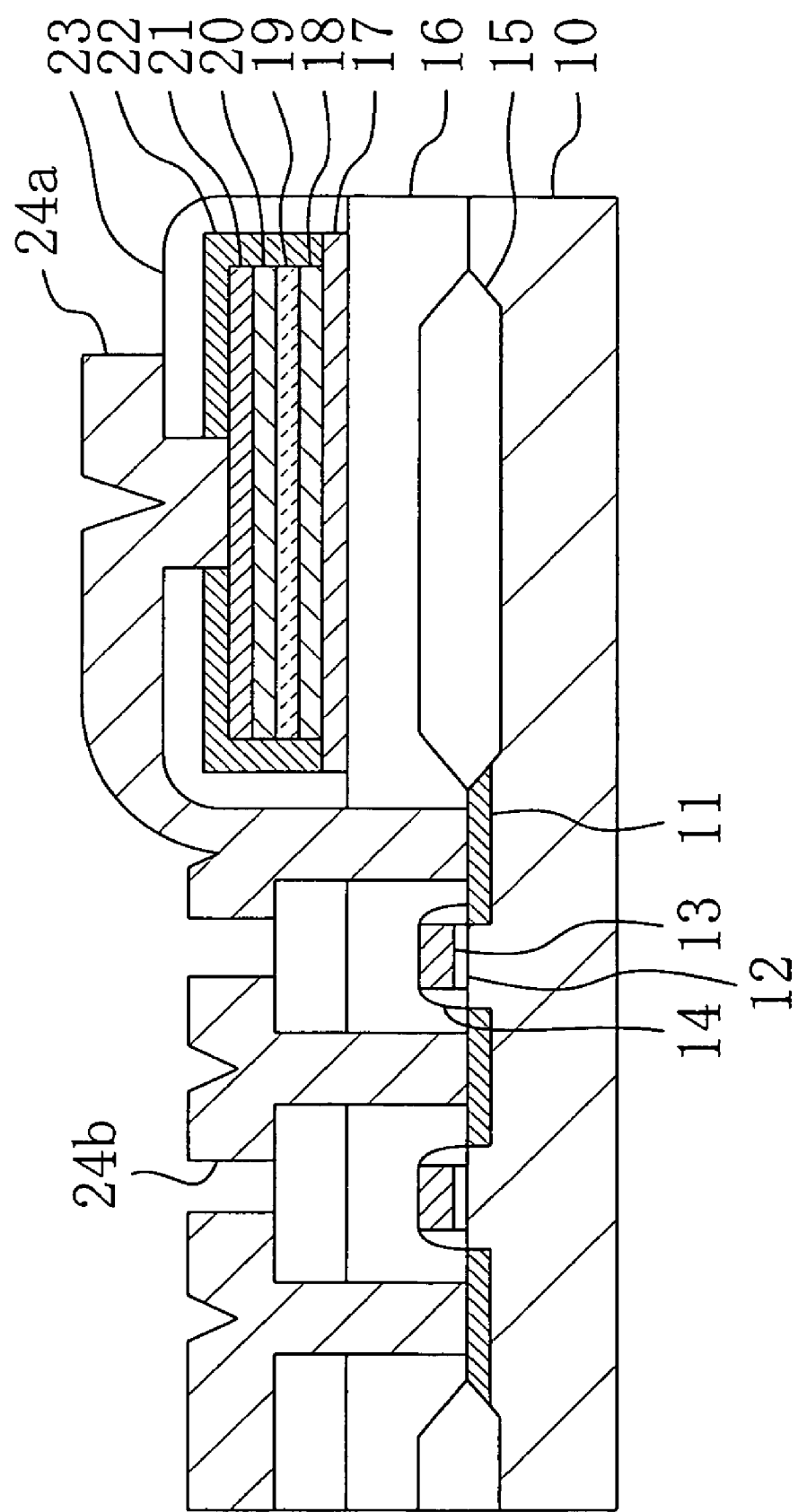
FIG. 11 is a sectional view of a conventional semiconductor device with a ferroelectric capacitor.

Next, as shown in FIGS. 10(d) and 10(e), on the first hydrogen barrier film 802, the third hydrogen barrier film 809 made of a titanium aluminum nitride film is formed in an atmosphere containing atoms of the common type (nitrogen atoms in this embodiment) contained in the first and third hydrogen barrier films 802 and 809. One concrete example of the formation method of the third hydrogen barrier film 809 is a reactive spattering method in which titanium aluminum spattered from a target of titanium aluminum is nitrided in a nitrogen atmosphere. Although FIG. 10(e) shows the final structure in which the first and third hydrogen barrier films 802 and 809 are patterned, it is also acceptable that these films are not patterned.

As described above, in the eighth embodiment, the third hydrogen barrier film 809 is formed in the atmosphere including atoms of the type commonly contained in the first and third hydrogen barrier films 802 and 809, whereby the atoms that exist in this atmosphere and are of the type commonly contained in the first and third hydrogen barrier films 802 and 809 are taken into a region 802a in FIG. 10(d) that will be the contact portion between the first and third hydrogen barrier films 802 and 809. Therefore, the first and third hydrogen barrier films 802 and 809 are not merely in physical contact with but in chemically-bonded connection to each other. This improves the adhesion between the first hydrogen barrier film 802 and the third hydrogen barrier film 809, which decreases degradation of the polarization properties of the capacitor insulating film 806 made of a ferroelectric film or a high dielectric film. Moreover, in this case, no silicon oxide film functioning as a hydrogen diffusion path is formed in the contact portion between the first and third hydrogen barrier films 802 and 809.

In the eighth embodiment, description has been made of the method for performing reactive spattering in the nitrogen atmosphere when the first and third hydrogen barrier films 802 and 809 contain nitrogen atoms. However, the present invention is not limited to this, and it is sufficient to perform reactive spattering in an atmosphere including atoms of the type commonly contained in the hydrogen barrier films.

Furthermore, in the eighth embodiment, the ferroelectric capacitor shown in, for example, FIG. 10(e) has the structure in which the lower electrode 805 serves as a capacitance definition unit. Alternatively, the ferroelectric capacitor may have the structure in which the upper electrode 807 serves as a capacitance definition unit.

Moreover, the eighth embodiment describes the case where the capacitor insulating film 806 is made of an SBT film as a ferroelectric film. Alternatively, the capacitor insulating film 806 made of a material capable of being reduced, such as a PZT-based film, a BLT-based film, a BST-based film, or a tantalum oxide film, can attain the same effect. In addition, the eighth embodiment describes the case where the capacitor insulating film 806 is made of a ferroelectric film. However, it goes without saying that the same effect can be exerted even in the case where the capacitor insulating film 806 is made of a high dielectric film.

In each of the embodiments described above, description has been made of the case where the ferroelectric capacitor has a stacked structure. However, the capacitor structure in the present invention is not limited to this.

What is claimed is:

1. A semiconductor device comprising:
a first hydrogen barrier film having an oxidized region in a surface thereof;
a capacitor device formed on the first hydrogen barrier film; and
a second hydrogen barrier film which contains oxygen and which is formed to cover the capacitor device,
wherein the first and second hydrogen barrier films adhere to each other by oxygen bonding while the oxidized region located around the perimeter of the capacitor device is interposed therebetween.

2. A semiconductor device comprising:
a first hydrogen barrier film having a nitrided region in a surface thereof;
a capacitor device formed on the first hydrogen barrier film; and
a second hydrogen barrier film which contains nitrogen and which is formed to cover the capacitor device,
wherein the first and second hydrogen barrier films adhere to each other by nitrogen bonding while the nitrided region located around the perimeter of the capacitor device is interposed therebetween.

3. The semiconductor device of claim 1 or 2, wherein the first and second hydrogen barrier films adhere to each other so that no silicon oxide film is interposed between the first and second hydrogen barrier films.

4. The semiconductor device of claim 1 or 2, wherein the first and second hydrogen barrier films are films made of the same material.

5. The semiconductor device of claim 1 or 2, wherein the capacitor device comprises a lower electrode formed above the first hydrogen barrier film, a capacitor insulating film formed on the lower electrode, and an upper electrode formed on the capacitor insulating film, and
the capacitor insulating film is made of a ferroelectric film or a high dielectric film.

6. The semiconductor device of claim 5, wherein the capacitor insulating film is made of $SrBi_2(Ta_xNb_{1-x})_2O_9$, $Pb(Zr_xTi_{1-x})O_3$, $(Ba_xSr_{1-x})TiO_3$, $(Bi_xLa_{1-x})_4Ti_3O_{12}$ (where x satisfies $0 \leq x \leq 1$ in the above chemical formulas), or $Ta_2O_5$.

* * * * *